(12) United States Patent
Nakahara et al.

(10) Patent No.: US 8,609,318 B2
(45) Date of Patent: Dec. 17, 2013

(54) RADIATION-SENSITIVE RESIN COMPOSITION, METHOD FOR FORMING RESIST PATTERN AND POLYMER

(75) Inventors: Kazuo Nakahara, Tokyo (JP); Hiromitsu Nakashima, Tokyo (JP); Reiko Kimura, Tokyo (JP)

(73) Assignee: JSR Corporation, Tokyo (JP)

( * ) Notice: Subject to any disclaimer, the term of this patent is extended or adjusted under 35 U.S.C. 154(b) by 104 days.

(21) Appl. No.: 13/204,555

(22) Filed: Aug. 5, 2011

(65) Prior Publication Data

US 2012/0034560 A1 Feb. 9, 2012

(30) Foreign Application Priority Data

Aug. 5, 2010 (JP) ................. 2010-176833

(51) Int. Cl.
*G03F 7/00* (2006.01)
*G03F 7/004* (2006.01)
*G03F 7/028* (2006.01)
*G03F 7/20* (2006.01)

(52) U.S. Cl.
USPC .......... 430/270.1; 430/322; 430/913

(58) Field of Classification Search
USPC .............. 430/270.1, 913
See application file for complete search history.

(56) References Cited

U.S. PATENT DOCUMENTS

| 7,700,260 B2 * | 4/2010 | Kanna et al. | 430/270.1 |
| 7,914,967 B2 * | 3/2011 | Furuya et al. | 430/270.1 |
| 8,389,200 B2 * | 3/2013 | Kanna et al. | 430/270.1 |

FOREIGN PATENT DOCUMENTS

| JP | 06-012452 B | 5/1984 |
| JP | 59-093448 | 5/1984 |
| JP | 63127237 A * | 5/1988 |
| JP | 05-188598 | 7/1993 |
| JP | 2005-352384 | 12/2005 |
| JP | 2006171667 A * | 6/2006 |
| JP | 2007-304537 | 11/2007 |
| JP | 2008-088343 | 4/2008 |
| JP | 2008-268931 | 11/2008 |
| JP | 2009-134088 | 6/2009 |
| WO | WO 2007/116664 | 10/2007 |
| WO | WO 2009/051088 | 4/2009 |

OTHER PUBLICATIONS

Machine translation of JP 2006-171667 (no date).*

* cited by examiner

*Primary Examiner* — Amanda C. Walke
(74) *Attorney, Agent, or Firm* — Ditthavong Mori & Steiner, P.C.

(57) ABSTRACT

A radiation-sensitive resin composition includes (A) a polymer that includes a structural unit (I) including a group shown by the following formula (i), (B) a photoacid generator, and (C) a polymer that has a fluorine atom content lower than that of the polymer (A), and includes an acid-labile group. The polymer (A) preferably includes a structural unit shown by the following formula (1) as the structural unit (I). It is preferable that X in the formula (1) represent a divalent or trivalent chain-like hydrocarbon group or alicyclic hydrocarbon group.

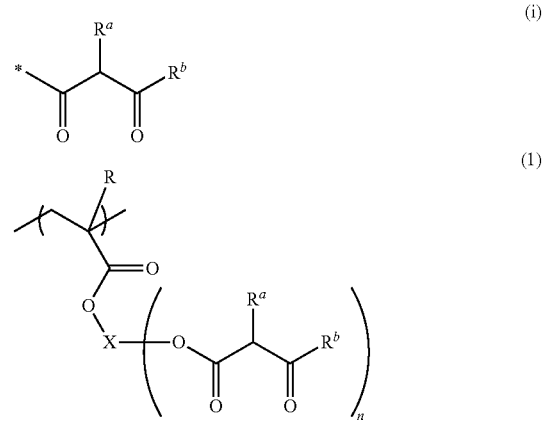

7 Claims, No Drawings

RADIATION-SENSITIVE RESIN COMPOSITION, METHOD FOR FORMING RESIST PATTERN AND POLYMER

CROSS-REFERENCE TO RELATED APPLICATIONS

The present application claims priority under 35 U.S.C. §119 to Japanese Patent Application No. 2010-176833, filed Aug. 5, 2010. The contents of this application are incorporated herein by reference in their entirety.

BACKGROUND OF THE INVENTION

1. Field of the Invention

The invention relates to a radiation-sensitive resin composition, a method for forming a resist pattern, and a polymer.

2. Discussion of the Background

In the field of microfabrication such as production of integrated circuit devices, a fine resist pattern is formed by forming a resist film on a substrate using a resin composition including an acid-dissociable group-containing polymer, exposing the resist film by applying short-wavelength radiation (e.g., excimer laser light) to the resist film via a mask pattern, and removing the exposed area using an alkaline developer. This process may utilize a chemically-amplified resist that includes a photoacid generator that generates an acid upon irradiation, and exhibits improved sensitivity due to the acid.

Liquid immersion lithography has become widespread as a method that forms a finer resist pattern having a line width of about 45 nm using the chemically-amplified resist. According to liquid immersion lithography, the resist film is exposed in a state in which the exposure optical path (i.e., the space between the lens and the resist film) is filled with an immersion medium (e.g., purified water or fluorine-containing inert liquid) that has a refractive index (n) higher than that of air and inert gas. Therefore, the depth of focus decreases to only a small extent, and high resolution can be obtained even if the numerical aperture (NA) of the lens is increased.

A resin composition used for liquid immersion lithography is required to prevent a decrease in film performance and contamination of the apparatus (e.g., lens) by suppressing elution of the acid generator and the like from the resist film into the immersion medium, and make it possible to implement high-speed scan exposure by preventing a situation in which watermarks remain through an improvement in draining capability of the surface of the resist film. For example, Japanese Patent Application Publication (KOKAI) No. 2005-352384 discloses technology that forms an upper-layer film (protective film) on the resist film in order to deal with such a demand. A method that improves the hydrophobicity of the surface of the resist film has been examined. For example, WO2007/116664 discloses a resin composition that contains a fluorine-containing polymer having high hydrophobicity. Japanese Patent Application Publication (KOKAI) No. 2008-268931 discloses technology that introduces an alkali-soluble unit in a fluorine-containing polymer.

SUMMARY OF THE INVENTION

According to one aspect of the invention, a radiation-sensitive resin composition includes (A) a polymer that includes a structural unit (I) including a group shown by a formula (i), (B) a photoacid generator, and (C) a polymer that has a fluorine atom content lower than that of the polymer (A), and includes an acid-labile group,

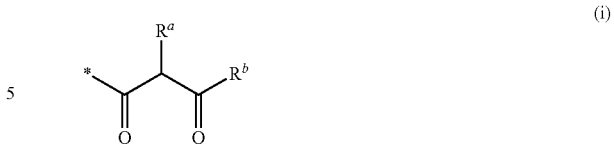

wherein $R^a$ represents a hydrogen atom, a halogen atom, a nitro group, —$R^{a1}$, —O—$R^{a1}$, —CO—$R^{a1}$, or —CO—O—$R^{a1}$ (wherein $R^{a1}$ represents a monovalent chain-like hydrocarbon group having 1 to 20 carbon atoms, a monovalent alicyclic hydrocarbon group having 3 to 20 carbon atoms, a monovalent aromatic hydrocarbon group having 6 to 30 carbon atoms, or a monovalent aromatic-aliphatic hydrocarbon group having 7 to 30 carbon atoms), $R^b$ represents a monovalent chain-like hydrocarbon group having 1 to 10 carbon atoms that includes at least one fluorine atom, or a monovalent alicyclic hydrocarbon group having 3 to 20 carbon atoms that includes at least one fluorine atom, provided that $R^b$ and $R^a$ may bond to each other to form a cyclic structure including at least one fluorine atom, and "*" indicates a bonding site, provided that a plurality of $R^a$ and a plurality of $R^b$ may respectively be either the same or different when n is 2 or 3.

According to another aspect of the invention, a polymer includes a structural unit (I) including a group shown by a formula (i), and at least one structural unit selected from the group consisting of a structural unit (II) shown by a formula (2) and a structural unit (III) shown by a formula (3),

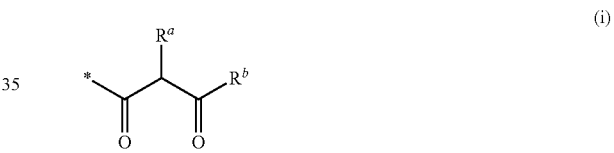

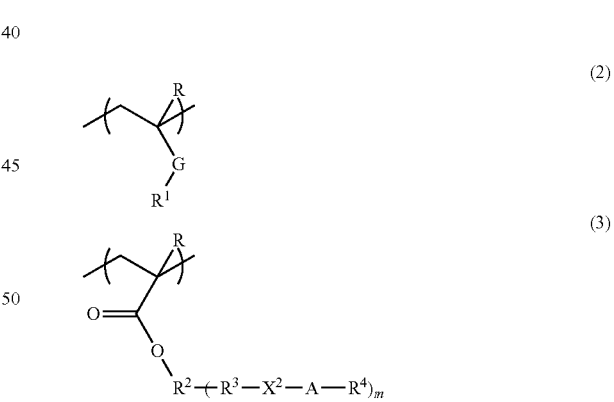

wherein $R^a$ represents a hydrogen atom, a halogen atom, a nitro group, —$R^{a1}$, —O—$R^{a1}$, —CO—$R^{a1}$, or —CO—O—$R^{a1}$ (wherein $R^{a1}$ represents a monovalent chain-like hydrocarbon group having 1 to 20 carbon atoms, a monovalent alicyclic hydrocarbon group having 3 to 20 carbon atoms, a monovalent aromatic hydrocarbon group having 6 to 30 carbon atoms, or a monovalent aromatic-aliphatic hydrocarbon group having 7 to 30 carbon atoms), $R^b$ represents a monovalent chain-like hydrocarbon group having 1 to 10 carbon atoms that includes at least one fluorine atom, or a monovalent alicyclic hydrocarbon group having 3 to 20 carbon atoms that includes at least one fluorine atom, provided that $R^b$ and $R^a$ may bond to each other to form a cyclic structure including at least one fluorine atom, and "*" indicates a bonding site, R represents a hydrogen atom, a methyl group, or a trifluoromethyl group, G represents a single bond, an oxygen atom, a sulfur atom, —CO—O—, —SO$_2$—O—NH—, —CO—NH—, or —O—CO—NH—, $R^1$ represents a monovalent chain-like hydrocarbon group having 1 to 6 carbon atoms that includes at least one fluorine atom, or a monovalent alicyclic hydrocarbon group having 4 to 20 carbon atoms that includes at least one fluorine atom, $R^2$ represents an (m+1)-valent hydrocarbon group having 1 to 20 carbon atoms, provided that an oxygen atom, a sulfur atom, —NR'— (wherein R' represents a hydrogen atom or a monovalent organic group), a carbonyl group, —CO—O—, or —CO—NH— may be bonded to an end of $R^2$ that is bonded to $R^3$, $R^3$ represents a single bond, a divalent chain-like hydrocarbon group having 1 to 10 carbon atoms, or a divalent alicyclic hydrocarbon group having 4 to 20 carbon atoms, $X^2$ represents a divalent chain-like hydrocarbon group having 1 to 20 carbon atoms that includes at least one fluorine atom, A represents an oxygen atom, —NR"— (wherein R" represents a hydrogen atom or a monovalent organic group), —CO—O—*, or —SO$_2$—O—* (wherein "*" indicates a bonding site bonded to $R^4$), $R^4$ represents a hydrogen atom or a monovalent organic group, and m is an integer from 1 to 3, provided that a plurality of $R^3$, a plurality of $X^2$, a plurality of A, and a plurality of $R^4$ may respectively be either the same or different when m is 2 or 3.

DESCRIPTION OF THE EMBODIMENTS

Exemplary embodiments of the invention are described below. A radiation-sensitive resin composition according to one embodiment of the invention includes (A) a polymer that includes a structural unit (I) including a group shown by the following formula (i) (hereinafter may be referred to as "fluorine-containing group") (hereinafter may be referred to as "polymer (A)), (B) a photoacid generator (hereinafter may be referred to as "acid generator (B)), and (C) a polymer that has a fluorine atom content lower than that of the polymer (A), and includes an acid-labile group (hereinafter may be referred to as "polymer (C)).

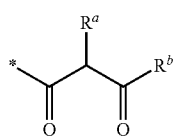

(i)

wherein $R^a$ represents a hydrogen atom, a halogen atom, a nitro group, —$R^{a1}$, —O—$R^{a1}$, —CO—$R^{a1}$, or —CO—O—$R^{a1}$ (wherein $R^{a1}$ represents a monovalent chain-like hydrocarbon group having 1 to 20 carbon atoms, a monovalent alicyclic hydrocarbon group having 3 to 20 carbon atoms, a monovalent aromatic hydrocarbon group having 6 to 30 carbon atoms, or a monovalent aromatic-aliphatic hydrocarbon group having 7 to 30 carbon atoms), $R^b$ represents a monovalent chain-like hydrocarbon group having 1 to 10 carbon atoms that includes at least one fluorine atom, or a monovalent alicyclic hydrocarbon group having 3 to 20 carbon atoms that includes at least one fluorine atom, provided that $R^b$ and $R^a$ may bond to each other to form a cyclic structure including at least one fluorine atom, and "*" indicates a bonding site.

The radiation-sensitive resin composition includes the polymer (A) that includes the structural unit (I) including a fluorine-containing group that includes a β-diketo structure, the acid generator (B), and the polymer (C) that has a fluorine atom content lower than that of the polymer (A), and includes an acid-labile group. Since the polymer (A) has a fluorine atom content and a hydrophobicity higher than those of the polymer (C), the polymer (A) is highly distributed over the surface of the resulting film as compared with the polymer (C). Specifically, the polymer (A) is unevenly distributed over the surface of the film. Therefore, the surface of the resist film has a high dynamic contact angle even if an upper-layer film that isolates the resist film from an immersion medium is not separately formed. Accordingly, the radiation-sensitive resin composition can suppress elution of the acid generator and the like from the film, and can provide the surface of the film with an excellent draining capability.

The fluorine-containing group has a structure in which a group that includes an electron-attracting fluorine atom is bonded to a β-diketo structure, and the hydrogen atom bonded to the carbon atom positioned between the carbonyl groups of the β-diketo structure has high acidity and readily dissociates. Therefore, the fluorine-containing group easily changes into an anionic group due to alkali during development.

As a result, the polymer (A) exhibits improved solubility in an alkaline developer and a rinse agent used after development, so that occurrence of development defects due to polymer aggregation can be suppressed. It is thus possible to allow the surface of the resist film to exhibit a high draining capability during exposure, and allow the polymer (A) to exhibit high solubility in an alkaline developer and a rinse agent.

The structural unit (I) is preferably a structural unit (I-1) shown by the following formula (1).

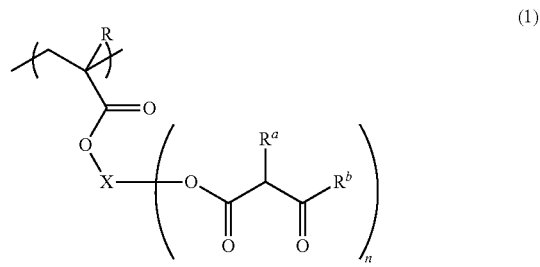

(1)

wherein R represents a hydrogen atom, a methyl group, or a trifluoromethyl group, X represents an (n+1)-valent linking group, $R^a$ and $R^b$ are the same as defined for the formula (i), and n is an integer from 1 to 3.

When the structural unit (I) has the specific structure shown by the formula (1), the structural unit (I) has a β-keto acid structure in which an oxygen atom is bonded to one end of the β-keto structure. Therefore, the hydrogen atom bonded to the carbon atom positioned between the carbonyl groups has higher acidity, so that the polymer (A) exhibits higher solubility in an alkaline developer and a rinse agent. Since a monomer that produces the structural unit (I-1) exhibits excellent polymerizability, the content of the structural unit (I-1) in the polymer (A) can be increased. This makes it possible to improve the draining capability of the surface of the resist film during exposure, and improve the solubility of the polymer (A) in an alkaline developer and a rinse agent.

It is preferable that X in the formula (1) represent a divalent or trivalent chain-like hydrocarbon group or alicyclic hydrocarbon group, and n be 1 or 2. If the linking group X in the polymer (A) is a divalent or trivalent chain-like hydrocarbon group or alicyclic hydrocarbon group, the hydrophobicity of the polymer (A) can be further improved, so that elution of the acid generator and the like from the resulting resist film can be further suppressed while improving the draining capability.

It is preferable that the content of the structural unit (I) in the polymer (A) be 3 to 100 mol % based on the total structural units. If the content of the structural unit (I) in the polymer (A) is within the above range, the dynamic contact angle during exposure can be further improved while further improving the solubility of the polymer (A) in an alkaline developer and a rinse agent.

It is preferable that $R^b$ in the formula (i) represent a trifluoromethyl group. If the $R^b$ group bonded to the diketone group is a trifluoromethyl group, the solubility of the polymer (A) in a developer and a rinse agent can be further improved, so that occurrence of development defects can be further suppressed.

It is preferable that the polymer (A) further include at least one structural unit selected from the group consisting of a structural unit (II) shown by the following formula (2) and a structural unit (III) shown by the following formula (3).

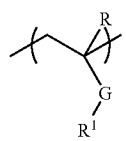
(2)

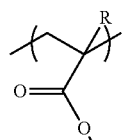
(3)

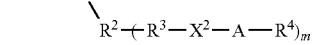

wherein R represents a hydrogen atom, a methyl group, or a trifluoromethyl group, G represents a single bond, an oxygen atom, a sulfur atom, —CO—O—, —SO$_2$—O—NH—, —CO—NH—, or —O—CO—NH—, $R^1$ represents a monovalent chain-like hydrocarbon group having 1 to 6 carbon atoms that includes at least one fluorine atom, a monovalent alicyclic hydrocarbon group having 4 to 20 carbon atoms that includes at least one fluorine atom, or a monovalent aromatic hydrocarbon group having 6 to 20 carbon atoms that includes at least one fluorine atom, $R^2$ represents an (m+1)-valent hydrocarbon group having 1 to 20 carbon atoms, provided that an oxygen atom, a sulfur atom, —NR'— (wherein R' represents a hydrogen atom or a monovalent organic group), a carbonyl group, —CO—O—, or —CO—NH— may be bonded to an end of $R^2$ that is bonded to $R^3$, $R^3$ represents a single bond, a divalent chain-like hydrocarbon group having 1 to 10 carbon atoms, or a divalent alicyclic hydrocarbon group having 4 to 20 carbon atoms, $X^2$ represents a divalent chain-like hydrocarbon group having 1 to 20 carbon atoms that includes at least one fluorine atom, A represents an oxygen atom, —NR"— (wherein R" represents a hydrogen atom or a monovalent organic group), —CO—O—*, or —SO$_2$—O—* (wherein "*" indicates a bonding site bonded to $R^4$), $R^4$ represents a hydrogen atom or a monovalent organic group, and m is an integer from 1 to 3, provided that a plurality of $R^3$, a plurality of $X^2$, a plurality of A, and a plurality of $R^4$ may respectively be either the same or different when m is 2 or 3.

If the polymer (A) further includes the above specific structural unit that includes a fluorine atom, the dynamic contact angle of the surface of a resist film formed using the radiation-sensitive resin composition can be further improved, so that the draining capability of the surface of the film during exposure can be further improved.

It is preferable that the radiation-sensitive resin composition include the polymer (A) in an amount of 0.1 to 10 parts by mass based on 100 parts by mass of the polymer (C). If the mass ratio of the polymer (A) to the polymer (C) is within the above range, the polymer (A) can be effectively segregated over the surface of the resist film, so that elution of the acid generator and the like from the resist film can be further suppressed. Moreover, the draining capability can be further improved due to an increase in the dynamic contact angle of the surface of the resist film.

A method for forming a resist pattern according to one embodiment of the invention includes (1) a step of forming a photoresist film on a substrate using the radiation-sensitive resin composition, (2) a step of providing an immersion liquid over the photoresist film, and subjecting the photoresist film to liquid immersion lithography via the immersion liquid, and (3) a step of developing the photoresist film subjected to liquid immersion lithography to form a resist pattern.

Since the method for forming a resist pattern utilizes the radiation-sensitive resin composition as a photoresist composition, the process time can be reduced by high-speed scan exposure since the surface of the film has a high draining capability. Moreover, an excellent resist pattern can be efficiently formed by suppressing occurrence of development defects.

A polymer according to one embodiment of the invention includes a structural unit (I) including a group shown by the following formula (i), and at least one structural unit selected from the group consisting of a structural unit (II) shown by the following formula (2) and a structural unit (III) shown by the following formula (3).

(i)

(2)

(3)

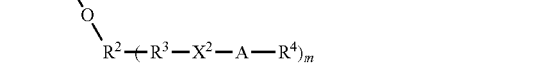

wherein $R^a$ represents a hydrogen atom, a halogen atom, a nitro group, —$R^{a1}$, —O—$R^{a1}$, —CO—$R^{a1}$, or —CO—O—$R^{a1}$ (wherein $R^{a1}$ represents a chain-like hydrocarbon group having 1 to 20 carbon atoms, an alicyclic hydrocarbon group having 3 to 20 carbon atoms, an aromatic hydrocarbon group having 6 to 30 carbon atoms, or an aromatic-aliphatic hydrocarbon group having 7 to 30 carbon atoms), $R^b$ represents a chain-like hydrocarbon group having 1 to 10 carbon atoms that includes at least one fluorine atom, or an alicyclic hydrocarbon group having 3 to 20 carbon atoms that includes at least one fluorine atom, provided that $R^b$ and $R^a$ may bond to each other to form a cyclic structure including at least one fluorine atom, "*" indicates a bonding site, R represents a hydrogen atom, a methyl group, or a trifluoromethyl group, G represents a single bond, an oxygen atom, a sulfur atom, —CO—O—, —SO$_2$—O—NH—, —CO—NH—, or —O—CO—NH—, $R^1$ represents a monovalent chain-like hydrocarbon group having 1 to 6 carbon atoms that includes at least one fluorine atom, or a monovalent alicyclic hydrocarbon group having 4 to 20 carbon atoms that includes at least one fluorine atom, $R^2$ represents an (m+1)-valent hydrocarbon group having 1 to 20 carbon atoms, provided that an oxygen atom, a sulfur atom, —NR'— (wherein R' represents a hydrogen atom or a monovalent organic group), a carbonyl group, —CO—O—, or —CO—NH— may be bonded to an end of $R^2$ that is bonded to $R^3$, $R^3$ represents a single bond, a divalent chain-like hydrocarbon group having 1 to 20 carbon atoms, or a divalent alicyclic hydrocarbon group having 4 to 20 carbon atoms, $X^2$ represents a divalent chain-like hydrocarbon group having 1 to 20 carbon atoms that includes at least one fluorine atom, A represents an oxygen atom, —NR"— (wherein R" represents a hydrogen atom or a monovalent organic group), —CO—O—*, or —SO$_2$—O—* (wherein "*" indicates a bonding site bonded to $R^4$), $R^4$ represents a hydrogen atom or a monovalent organic group, and m is an integer from 1 to 3, provided that a plurality of $R^3$, a plurality of $X^2$, a plurality of A, and a plurality of $R^4$ may respectively be either the same or different when m is 2 or 3.

The polymer includes the group shown by the formula (i) that includes a fluorine atom and a β-diketo structure, and at least one structural unit selected from the group consisting of the structural unit (II) that includes a fluorine atom and the structural unit (III) that includes a fluorine atom. Since such a polymer exhibits high hydrophobicity and becomes readily soluble upon contact with an alkaline developer, the dynamic contact angle of the surface of the resist film during exposure can be increased while improving solubility in an alkaline developer and a rinse agent, for example. Therefore, the polymer may suitably be used for a radiation-sensitive resin composition that is used for lithographic technology, for example.

The term "hydrocarbon group" used herein includes a chain-like hydrocarbon group, an alicyclic hydrocarbon group, and an aromatic hydrocarbon group. The hydrocarbon group may be a saturated hydrocarbon group or an unsaturated hydrocarbon group.

The term "chain-like hydrocarbon group" used herein refers to a hydrocarbon group that does not include a cyclic structure in the main chain, and includes only a chain-like structure. The term "chain-like hydrocarbon group" used herein includes a linear hydrocarbon group and a branched hydrocarbon group.

The term "alicyclic hydrocarbon group" used herein refers to a hydrocarbon group that includes only an alicyclic hydrocarbon structure as a cyclic structure, and does not include an aromatic ring structure. Note that the alicyclic hydrocarbon group need not necessarily include only an alicyclic hydrocarbon structure, but may also include a chain-like structure. The term "aromatic hydrocarbon group" used herein refers to a hydrocarbon group that includes an aromatic ring structure. Note that the aromatic hydrocarbon group need not necessarily include only an aromatic ring structure, but may also include a chain structure or an alicyclic hydrocarbon structure.

The embodiments of the invention are described in detail below. The radiation-sensitive resin composition according to one embodiment of the invention includes the polymer (A), the acid generator (B), and the polymer (C), and may optionally include (D) an acid diffusion controller, (E) a solvent, (F) an additive, and the like. Each component is described in detail below.

<Polymer (A)>

In one embodiment of the invention, the polymer (A) includes the structural unit (I) that includes the fluorine-containing group. Since the polymer (A) has a fluorine atom content higher than that of the polymer (C) (described later) (i.e., has a hydrophobicity higher than that of the polymer (C)), the polymer (A) tends to be unevenly distributed in the surface layer of a resist film that is formed using the polymers (A) and (C). As a result, elution of the acid generator and the like from the film can be suppressed. Moreover, since the surface of the film has a high dynamic contact angle, an excellent draining capability can be obtained. This makes it unnecessary to separately form an upper-layer film that isolates the surface of the resist film from an immersion medium.

Since the fluorine-containing group has a structure in which a fluorine-containing group is bonded to a β-diketo structure, the hydrogen atom bonded to the carbon atom positioned between the carbonyl groups of the β-diketo structure has high acidity and readily dissociates. Therefore, anionization occurs due to contact with an alkaline developer or the like, so that the polymer (A) exhibits improved solubility in an alkaline developer and a rinse agent. This makes it possible to suppress occurrence of development defects in the resist film due to polymer aggregation that may occur during the development step and the rinse step when the polymer that forms the resist film exhibits insufficient solubility in an alkaline developer.

It is preferable that the polymer (A) further include the structural units (II) and (III) as fluorine-containing structural units in addition to the structural unit (I). The polymer (A) may also include structural units (IV) to (VII) described later. Each structural unit is described below.

<Structural Unit (I)>

The structural unit (I) includes the group shown by the formula (i).

$R^a$ in the formula (i) represents a hydrogen atom, a halogen atom, a nitro group, —$R^{a1}$, —O—$R^{a1}$, —CO—$R^{a1}$, or —CO—O—$R^{a1}$ (wherein $R^{a1}$ represents a monovalent chain-like hydrocarbon group having 1 to 20 carbon atoms, a monovalent alicyclic hydrocarbon group having 3 to 20 carbon atoms, a monovalent aromatic hydrocarbon group having 6 to 30 carbon atoms, or a monovalent aromatic-aliphatic hydrocarbon group having 7 to 30 carbon atoms), $R^b$ represents a monovalent chain-like hydrocarbon group having 1 to 10 carbon atoms that includes at least one fluorine atom, or a monovalent alicyclic hydrocarbon group having 3 to 20 carbon atoms that includes at least one fluorine atom, provided that $R^b$ and $R^a$ may bond to each other to form a cyclic structure including at least one fluorine atom, and "*" indicates a bonding site.

$R^a$ in the formula (i) represents a hydrogen atom, a halogen atom, a nitro group, —$R^{a1}$, —O—$R^{a1}$, —CO—$R^{a1}$, or —CO—O—$R^{a1}$, and $R^{a1}$ represents a monovalent chain-like hydrocarbon group having 1 to 20 carbon atoms, a monovalent alicyclic hydrocarbon group having 3 to 20 carbon atoms, a monovalent aromatic hydrocarbon group having 6 to 30 carbon atoms, or a monovalent aromatic-aliphatic hydrocarbon group having 7 to 30 carbon atoms.

Examples of the halogen atom include a fluorine atom, a chlorine atom, a bromine atom, and an iodine atom. Among these, a fluorine atom or a chlorine atom is preferable.

Examples of the monovalent chain-like hydrocarbon group having 1 to 20 carbon atoms include a methyl group, an ethyl group, a linear or branched propyl group, a butyl group, a pentyl group, a hexyl group, a heptyl group, an octyl group, a nonyl group, a decyl group, a dodecyl group, a tetradecyl group, a hexadecyl group, an octadecyl group, an icosyl group, and the like.

Examples of the monovalent alicyclic hydrocarbon group having 3 to 20 carbon atoms include monocyclic hydrocarbon groups such as a cyclopropyl group, a cyclopentyl group, a cyclohexyl group, a cyclooctyl group, a cyclodecyl group, and a cyclododecyl group; polycyclic hydrocarbon groups such as an adamantyl group, a norbornyl group, and a tetracyclodecanyl group; and the like.

Examples of the monovalent aromatic hydrocarbon group having 6 to 30 carbon atoms include a phenyl group, a tolyl group, a dimethylphenyl group, a 2,4,6-trimethylphenyl group, a naphthyl group, an anthryl group, a 9,10-dimethoxy-anthryl group, and the like.

Examples of the monovalent aromatic-aliphatic hydrocarbon group having 7 to 30 carbon atoms include a benzyl group, a phenethyl group, a naphthylmethyl group, and the like.

$R^b$ in the formula (i) represents a monovalent chain-like hydrocarbon group having 1 to 10 carbon atoms that includes at least one fluorine atom, or a monovalent alicyclic hydrocarbon group having 3 to 20 carbon atoms that includes at least one fluorine atom.

Examples of the monovalent chain-like hydrocarbon group having 1 to 10 carbon atoms that includes at least one fluorine atom include groups obtained by substituting at least one hydrogen atom of a chain-like hydrocarbon group having 1 to 10 carbon atoms with a fluorine atom. Specific examples of the chain-like hydrocarbon group include a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, a 3-(3-methylpentyl) group, an octyl group, a nonyl group, a decyl group, and the like.

Examples of the monovalent alicyclic hydrocarbon group having 3 to 20 carbon atoms that includes at least one fluorine atom include groups obtained by substituting at least one hydrogen atom of an alicyclic hydrocarbon group having 3 to 20 carbon atoms with a fluorine atom. Examples of the alicyclic hydrocarbon group include a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl) group, a cycloheptyl group, a cycloheptylmethyl group, a 1-(1-cycloheptylethyl) group, a 1-(2-cycloheptylethyl) group, a 2-norbornyl group, a 1-adamantyl group, a 2-adamantyl group, and the like.

The number of fluorine atoms included in the chain-like hydrocarbon group or the alicyclic hydrocarbon group represented by $R^b$ is 1 or more. It is preferable that the number of fluorine atoms included in the chain-like hydrocarbon group or the alicyclic hydrocarbon group represented by $R^b$ be as large as possible. The acidity of the hydrogen atom bonded to the carbon atom positioned between the carbonyl groups of the β-diketo structure increases as the number of fluorine atoms increases, so that the solubility of a film formed using the radiation-sensitive resin composition is further improved. For example, when $R^b$ represents a butyl group that includes at least one fluorine atom, the number of fluorine atoms that substitute the butyl group is preferably 3 or more, more preferably 6 or more, and most preferably 9. It is preferable that a fluorine atom be bonded to the carbon atom at position 1 of the group represented by $R^b$ or the carbon atom adjacent thereto. For example, when $R^b$ represents an n-butyl group that is substituted with one fluorine atom, a 1-fluoro-n-butyl group or a 2-fluoro-n-butyl group is preferable, and a 1-fluorobutyl group is more preferable. It is preferable that $R^b$ represent a perfluoroalkyl group or a perfluorocycloalkyl group, more preferably a perfluoroalkyl group having 1 to 4 carbon atoms, and particularly preferably a trifluoromethyl group.

Specific examples of the group shown by the formula (i) include the groups shown by the following formulas (i-1) to (i-24). The polymer (A) may include only one type of group shown by the formula (i), or may include two or more types of group shown by the formula (i).

(i-1)

(i-2)

(i-3)

(i-4)

(i-5)

(i-6)

(i-7)

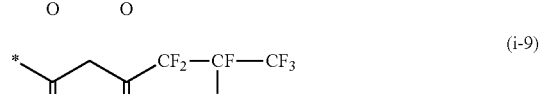
(i-8)

(i-9)

(i-10)

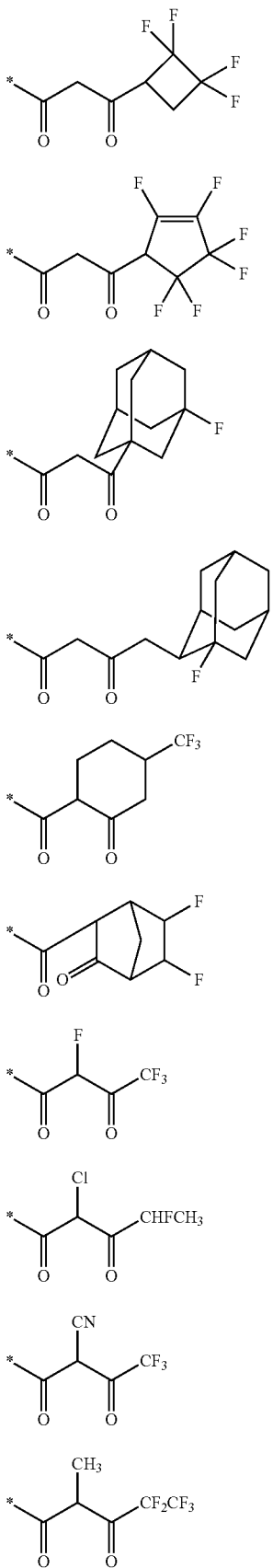

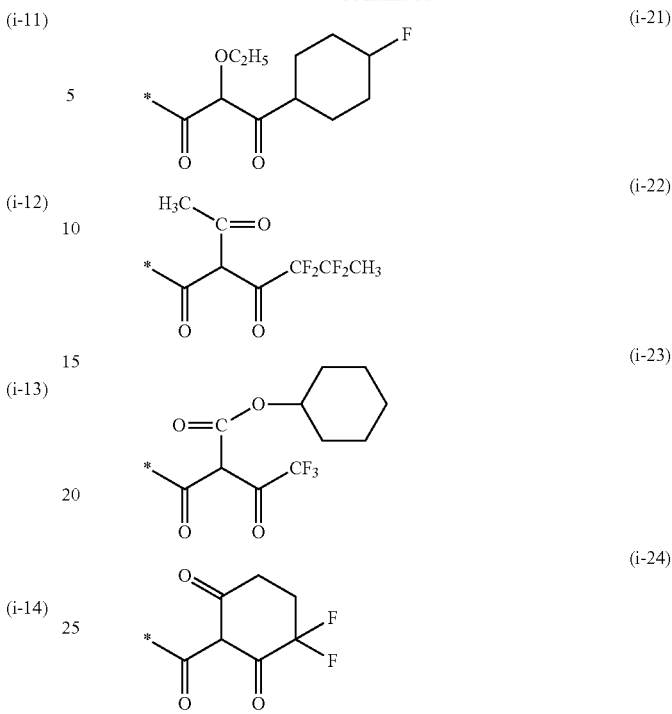

Among these, the groups shown by the formulas (i-1), (i-2), (i-3), (i-4), (i-5), (i-7), (i-8), (i-9), (i-10), (i-11), (i-12), (i-14), (i-15), (i-17), (i-19), (i-22), (i-23), and (i-24) are preferable, the groups shown by the formulas (i-1), (i-2), (i-5), (i-7), (i-17), (i-19), (i-22), and (i-23) are more preferable, and the group shown by the formula (i-1) is particularly preferable.

The structure of the structural unit (I) other than the group shown by the formula (i) is not particularly limited. The group that links the group shown by the formula (i) to the main chain of the polymer (A) is also arbitrary. Examples of the group that links the group shown by the formula (i) to the main chain of the polymer (A) include a divalent hydrocarbon group, a carbonyl group, an ester group, an amide group, a urethane group, a urea group, an ether group, a carbonate group, an imino group, a thioether group, a combination thereof, and the like. Among these, an ester group, an ether group, a divalent hydrocarbon group, or a combination thereof is particularly preferable from the viewpoint of the polymerizability of a monomer that produces the structural unit (I).

The structural unit (I-1) shown by the formula (1) is preferable as the structural unit (I).

$R^a$ and $R^b$ in the formula (1) are the same as defined for the formula (i), R represents a hydrogen atom, a methyl group, or a trifluoromethyl group, X represents an (n+1)-valent linking group, and n is an integer from 1 to 3, provided that a plurality of $R^a$ and a plurality of $R^b$ may respectively be either the same or different when n is 2 or 3.

R preferably represents a methyl group.

Specific examples of the (n+1)-valent linking group represented by X include hydrocarbon groups obtained by removing (n+1) (n is an integer from 1 to 3) hydrogen atoms from chain-like hydrocarbons such as linear or branched chain-like saturated hydrocarbons such as methane, ethane, propane, butane, pentane, hexane, octane, decane, hexadecane, and icosane; linear or branched chain-like unsaturated hydrocarbons such as ethylene, propylene, butene, pentene, hexene, octene, decene, tetradecene, propyne, hexyne, butadiene, hexadiene, decadiene, hexadiyne, and decadiyne; alicyclic hydrocarbons such as monocyclic saturated hydrocarbons such as cyclopropane, cyclobutane, cyclopentane, cyclohexane, cyclooctane, and cyclodecane; monocyclic unsaturated hydrocarbons such as cyclobutene, cyclopentene, cyclohexene, cyclooctene, cyclodecene, cyclododecyne, cyclopentadiene, cyclohexadiene, cyclodecadiene, and cyclodecadiyne; polycyclic saturated hydrocarbons such as bicyclo[2.2.1]heptane, bicyclo[2.2.2]octane, tricyclo[5.2.1$^{2,6}$]decane, tricyclo[3.3.1.1$^{3,7}$]decane, tetracyclo[6.2.1.1$^{3,6}$.0$^{2,7}$]dodecane, and adamantane; polycyclic unsaturated hydrocarbons such as bicyclo[2.2.1]heptene, bicyclo[2.2.2]octene, tricyclo[5.2.1$^{2,6}$]decene, tricyclo[3.3.1.1$^{3,7}$]decene, and tetracyclo[6.2.1.1$^{3,6}$.0$^{2,7}$]dodecene; and aromatic hydrocarbons such as benzene, naphthalene, anthracene, phenanthrene, pyrene, toluene, xylene, trimethylbenzene, ethylbenzene, cumene, methylnaphthalene, dimethylnaphthalene, and durene.

Among these, hydrocarbon groups obtained by removing (n+1) hydrogen atoms from linear or branched chain-like saturated hydrocarbons having 1 to 8 carbon atoms, alicyclic hydrocarbons having 5 to 12 carbon atoms, chain-like unsaturated hydrocarbons having 2 to 6 carbon atoms, and aromatic hydrocarbons having 6 to 15 carbon atoms, are preferable.

The linking group X may include an ether group, a carbonyl group, an ester group, an amide group, a urethane group, a urea group, a carbonate group, an imino group, a thioether group, or the like at the end position or a position other than the end position, and may form a heterocyclic ring including such a group.

The linking group X may be substituted with a substituent. Examples of the substituent include —$R^{P1}$, $R^{P2}$—O—$R^{P1}$, $R^{P2}$—CO—$R^{P1}$, $R^{P2}$—CO—O$R^{P1}$, —$R^{P2}$—O—CO—$R^{P1}$, —$R^{P2}$—OH, —$R^{P2}$—CN, —$R^{P2}$—COOH (wherein $R^{P1}$ represents a monovalent chain-like saturated hydrocarbon group having 1 to 10 carbon atoms, a monovalent alicyclic saturated hydrocarbon group having 3 to 20 carbon atoms, or a monovalent aromatic hydrocarbon group having 6 to 30 carbon atoms (some or all of the hydrogen atoms of these groups may be substituted with a fluorine atom), and $R^2$ represents a single bond, a divalent chain-like saturated hydrocarbon group having 1 to 10 carbon atoms, a divalent alicyclic saturated hydrocarbon group having 3 to 20 carbon atoms, a divalent aromatic hydrocarbon group having 6 to 30 carbon atoms, or a group obtained by substituting some or all of the hydrogen atoms of these groups with a fluorine atom), a halogen atom (e.g., fluorine atom or chlorine atom), and the like.

n is preferably 1 or 2, and more preferably 1.

The linking group X (i.e., the linking group represented by X) is preferably a divalent or trivalent chain-like hydrocarbon group or a divalent or trivalent alicyclic hydrocarbon group, and more preferably a divalent chain-like hydrocarbon group or a divalent alicyclic hydrocarbon group.

The divalent linking group represented by X when n is 1 is preferably a linear or branched divalent chain-like saturated hydrocarbon group having 1 to 8 carbon atoms or a divalent alicyclic hydrocarbon group having 5 to 12 carbon atoms, more preferably an ethylene group, a propylene group, a butylene group, a cyclopentanediyl group, a cyclohexanediyl group, a norbornanediyl group, or an adamantanediyl group, and still more preferably an ethylene group.

The trivalent linking group represented by X when n is 2 is preferably a linear or branched trivalent chain-like saturated hydrocarbon group having 1 to 8 carbon atoms or a trivalent alicyclic hydrocarbon group having 5 to 12 carbon atoms, more preferably an ethanetriyl group, a propanetriyl group, a butanetriyl group, a cyclopentanetriyl group, a cyclohexanetriyl group, a norbornanetriyl group, or an adamantanetriyl group, and still more preferably an ethanetriyl group.

Further specific examples of the linking group X include (n+1)-valent linking groups shown by the following formulas (X-1) and (X-2).

wherein $R^x$ represents an (n+1)-valent hydrocarbon group, $R^y$ represents a divalent hydrocarbon group, Q represents an ether group, a carbonyl group, an ester group, an amide group, a urethane group, a urea group, a carbonate group, an imino group, or a thioether group, n is an integer from 1 to 3, and "*" indicates a bonding site that is bonded to the group shown by the formula (i).

Note that a plurality of Q and a plurality of $R^y$ may respectively be either the same or different when n is 2 or 3.

Examples of the (n+1)-valent hydrocarbon group represented by $R^x$ include the (n+1)-valent hydrocarbon groups mentioned above in connection with the linking group X.

Examples of the divalent hydrocarbon group represented by $R^x$ include the divalent hydrocarbon groups (i.e., the (n+1)-valent hydrocarbon group when n is 1) mentioned above in connection with the linking group X.

Q preferably represents an ether group, a carbonyl group, or an ester group since a monomer that produces the structural unit (I) can be easily synthesized.

Specific examples of a linking group shown by the formula (X-1) include the groups shown by the following formulas (X-1) to (X-1-6).

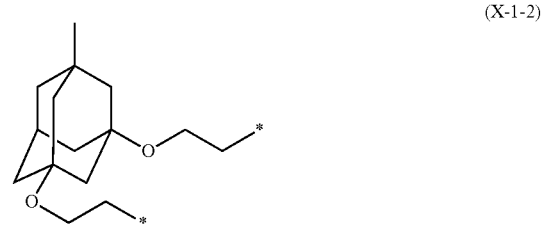

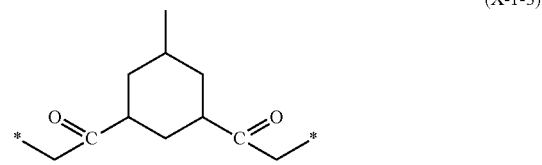

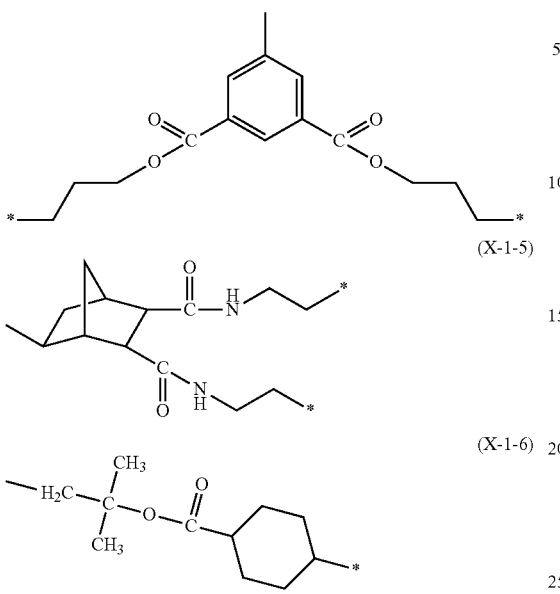
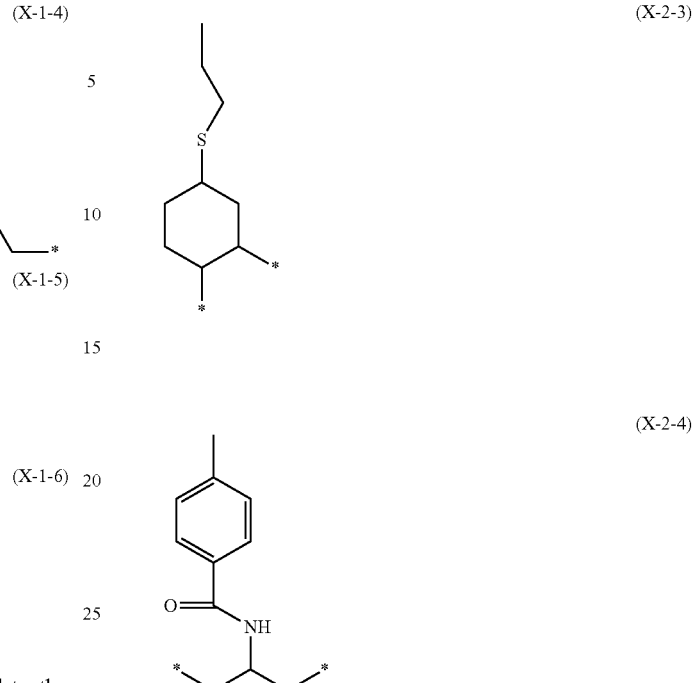

wherein "*" indicates a bonding site that is bonded to the group shown by the formula (i).

Among these, the linking groups shown by the formulas (X-1) and (X-1-2) are preferable from the viewpoint of the etching resistance of the resulting resist film.

Specific examples of an (n+1)-valent linking group shown by the formula (X-2) include the groups shown by the following formulas (X-1) to (X-2-6).

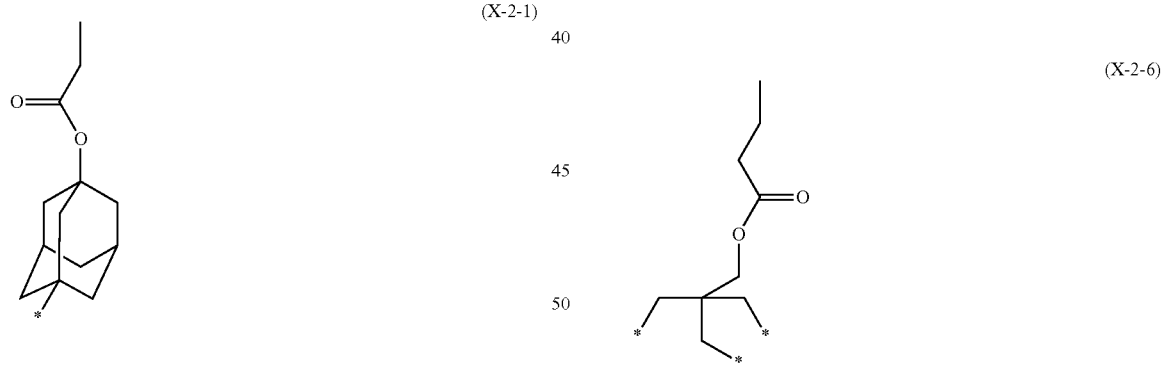

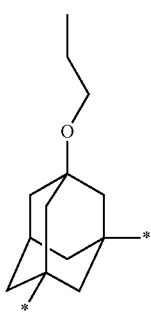

wherein "*" indicates a bonding site that is bonded to the group shown by the formula (i).

Among these, the groups shown by the formulas (X-2-1) and (X-2-2) are preferable from the viewpoint of the etching resistance of the resulting resist film.

Preferable specific examples of the structural unit (I-1) shown by the formula (1) include structural units shown by the following formulas (1-1) to (1-10). The structural units shown by the formulas (1-5) to (1-10) include the linking group shown by the formula (X-1) or (X-2). The polymer (A) may include only one type of structural unit (I), or may include two or more types of structural unit (I).

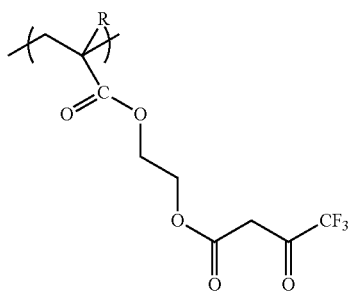 (1-1)
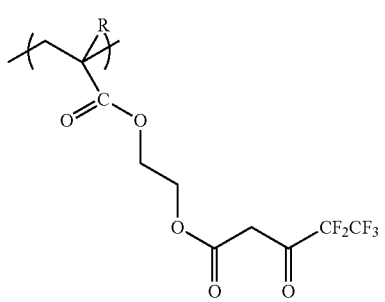 (1-2)
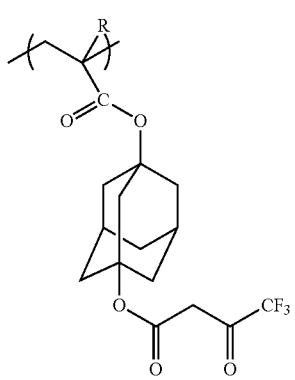 (1-3)
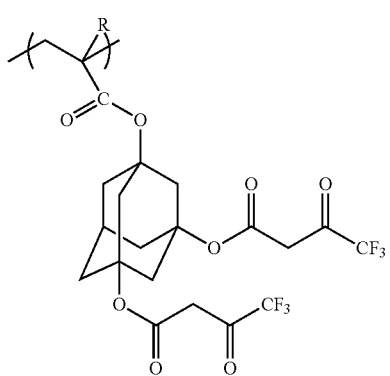 (1-4)
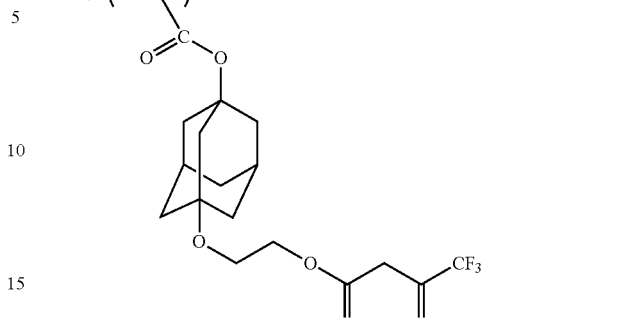 (1-5)
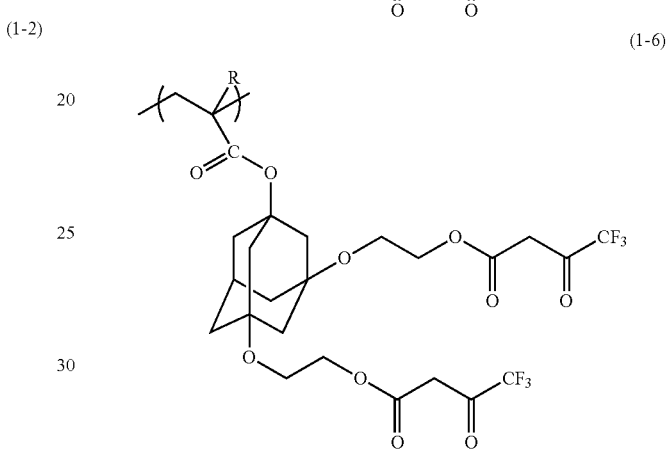 (1-6)
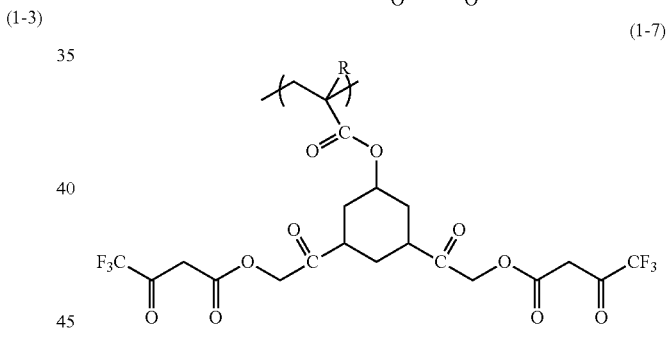 (1-7)
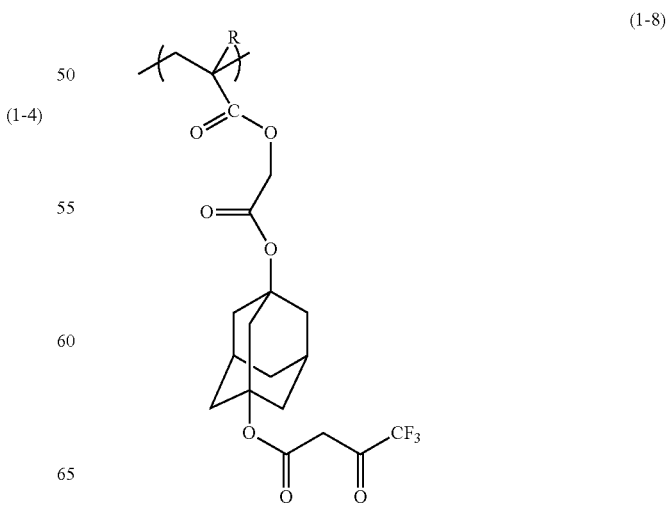 (1-8)

-continued (1-9)
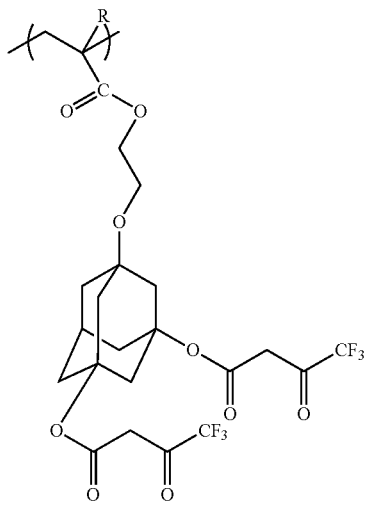

(1-10)
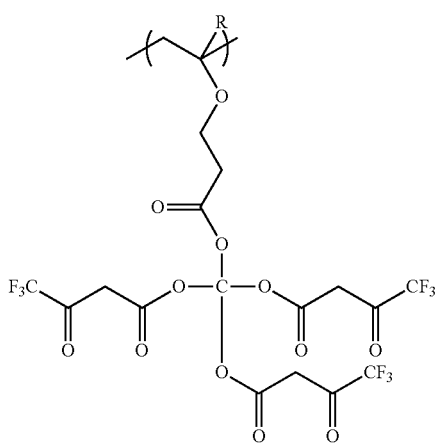

wherein R represents a hydrogen atom, a methyl group, or a trifluoromethyl group.

Among these, the structural units shown by the formulas (1-1) to (1-5) are preferable, the structural units shown by the formulas (1-1) and (1-2) are more preferable, and the structural unit shown by the formula (1-1) is still more preferable, since the resulting resist film has a high dynamic contact angle during exposure, and exhibits higher solubility in an alkaline developer and a rinse agent.

A monomer that produces the structural unit (I) that includes the group shown by the formula (i) may be synthesized by (1) subjecting a functional group-containing ethylenically unsaturated compound and a fluorine atom-containing acetoacetate derivative to transesterification, (2) subjecting a functional group-containing ethylenically unsaturated compound and a fluorine atom-containing acetoacetic acid derivative to esterification, (3) reacting a functional group-containing ethylenically unsaturated compound with a fluorine atom-containing diketene derivative, or (4) reacting a functional group-containing alkyl derivative of a fluorine atom-containing acetoacetic acid with a (meth)acrylic halide or (meth)acrylic anhydride.

Examples of the functional group include a hydroxyl group, a carboxyl group, and the like.

A commercially available reagent such as ethyl 4,4,4-trifluoroacetoacetate or ethyl 3-oxo-4,4,5,5,5-pentafluoropentanoate may be used as the fluorine atom-containing acetoacetate derivative subjected to transesterification.

The content of the structural unit (I) in the polymer (A) is preferably 3 to 100 mol %, more preferably 5 to 95 mol %, and still more preferably 10 to 90 mol %, based on the total structural units included in the polymer (A). If the content of the structural unit (I) is 3 mol % or more, a resist film formed using the radiation-sensitive resin composition exhibits excellent solubility in an alkaline developer and a rinse agent.

<Structural Unit (II)>

The polymer (A) preferably includes the structural unit shown by the formula (2) as the structural unit (II). If the polymer (A) further includes the fluorine atom-containing structural unit (II), the polymer (A) exhibits improved hydrophobicity, so that the dynamic contact angle of the surface of a resist film formed using the radiation-sensitive resin composition can be further improved.

R in the formula (2) represents a hydrogen atom, a methyl group, or a trifluoromethyl group, G represents a single bond, an oxygen atom, a sulfur atom, —CO—O—, —SO$_2$—O—NH—, —CO—NH—, or —O—CO—NH—, and le represents a monovalent chain-like hydrocarbon group having 1 to 6 carbon atoms that includes at least one fluorine atom, a monovalent alicyclic hydrocarbon group having 4 to 20 carbon atoms that includes at least one fluorine atom, or a monovalent aromatic hydrocarbon group having 6 to 20 carbon atoms that includes at least one fluorine atom.

R preferably represents a methyl group.

Specific examples of the chain-like hydrocarbon group having 1 to 6 carbon atoms that includes at least one fluorine atom represented by $R^1$ include a trifluoromethyl group, a 2,2,2-trifluoroethyl group, a perfluoroethyl group, 2,2,3,3,3-pentafluoropropyl group, a 1,1,1,3,3,3-hexafluoropropyl group, a perfluoro-n-propyl group, a perfluoro-i-propyl group, a perfluoro-n-butyl group, a perfluoro-i-butyl group, a perfluoro-t-butyl group, a 2,2,3,3,4,4,5,5-octafluoropentyl group, a perfluorohexyl group, and the like.

Examples of the alicyclic hydrocarbon group having 4 to 20 carbon atoms that includes at least one fluorine atom represented by $R^1$ include a monofluorocyclopentyl group, a difluorocyclopentyl group, a perfluorocyclopentyl group, a monofluorocyclohexyl group, a difluorocyclopentyl group, a perfluorocyclohexylmethyl group, a fluoronorbornyl group, a fluoroadamantyl group, a fluorobornyl group, a fluoroisobornyl group, a fluorotricyclodecyl group, a fluorotetracyclodecyl group, and the like.

Examples of the aromatic hydrocarbon group having 6 to 20 carbon atoms that includes at least one fluorine atom represented by $R^1$ include a fluorophenyl group, a difluorophenyl group, a trifluorophenyl group, a trifluoromethylphenyl group, a di(trifluoromethyl)phenyl group, a tri(trifluoromethyl)phenyl group, a fluoronaphthyl group, a difluoronaphthyl group, a trifluoromethylnaphthyl group, a di(trifluoromethyl)naphthyl group, and the like.

Examples of a monomer that produces the structural unit (II) include trifluoromethyl(meth)acrylate, 2,2,2-trifluoroethyl(meth)acrylate, perfluoroethyl(meth)acrylate, perfluoro-n-propyl(meth)acrylate, perfluoro-i-propyl(meth)acrylate, perfluoro-n-butyl(meth)acrylate, perfluoro-i-butyl(meth)acrylate, perfluoro-t-butyl(meth)acrylate, 2-(1,1,1,3,3,3-hexafluoropropyl)(meth)acrylate, 1-(2,2,3,3,4,4,5,5-octafluoropentyl)(meth)acrylate, perfluorocyclohexylmethyl(meth)acrylate, 1-(2,2,3,3,3-pentafluoropropyl)(meth)acrylate, monofluorocyclopentyl(meth)acrylate, difluorocyclopentyl(meth)acrylate, perfluorocyclopentyl(meth)acrylate, monofluorocyclohexyl(meth)acrylate, difluorocyclopentyl(meth)acrylate, perfluorocyclohexylmethyl(meth)acrylate, fluoronorbornyl(meth)acrylate, fluoroadamantyl(meth)acrylate, fluorobornyl(meth)acrylate, fluoroisobornyl(meth)acrylate, fluorotricyclodecyl(meth)acrylate, fluorotetracyclodecyl(meth)acrylate, fluorophenyl(meth)acrylate, difluorophenyl(meth)acrylate, trifluorophenyl(meth)acrylate, trifluoromethylphenyl(meth)acrylate, di(trifluoromethyl)phenyl(meth)acrylate, tri(trifluoromethyl)phenyl(meth)acrylate, fluoronaphthyl(meth)acrylate, difluoronaphthyl(meth)acrylate, trifluoromethylnaphthyl(meth)acrylate, di(trifluoromethyl)naphthyl(meth)acrylate, and the like.

The content of the structural unit (II) in the polymer (A) is preferably 0 to 50 mol %, more preferably 0 to 40 mol %, and still more preferably 5 to 35 mol %, based on the total structural units included in the polymer (A). If the content of the structural unit (II) is within the above range, the surface of the resist film has a higher dynamic contact angle during liquid immersion lithography. The polymer (A) may include only one type of structural unit (II), or may include two or more types of structural unit (II).

<Structural Unit (III)>

The polymer (A) preferably includes the structural unit shown by the formula (3) as the structural unit (III). If the polymer (A) further includes the fluorine atom-containing structural unit (III), the polymer (A) exhibits improved hydrophobicity, so that the dynamic contact angle of the surface of a resist film formed using the radiation-sensitive resin composition can be further improved.

R in the formula (3) represents a hydrogen atom, a methyl group, or a trifluoromethyl group, $R^2$ represents an (m+1)-valent hydrocarbon group having 1 to 20 carbon atoms, provided that an oxygen atom, a sulfur atom, —NR'—, a carbonyl group, —CO—O—, or —CO—NH— may be bonded to an end of $R^2$ that is bonded to $R^3$, R' represents a hydrogen atom or a monovalent organic group, $R^3$ represents a single bond, a divalent chain-like hydrocarbon group having 1 to 20 carbon atoms, or a divalent alicyclic hydrocarbon group having 4 to 20 carbon atoms, $X^2$ represents a divalent chain-like hydrocarbon group having 1 to 20 carbon atoms that includes at least one fluorine atom, A represents an oxygen atom, —NR"—, —CO—O—, or —SO$_2$—O—, R" represents a hydrogen atom or a monovalent organic group, "**" indicates a bonding site bonded to $R^4$, $R^4$ represents a hydrogen atom or a monovalent organic group, and m is an integer from 1 to 3, provided that a plurality of $R^3$, a plurality of $X^2$, a plurality of A, and a plurality of $R^4$ may respectively be either the same or different when m is 2 or 3.

R preferably represents a methyl group.

Examples of the (m+1)-valent hydrocarbon group having 1 to 20 carbon atoms represented by $R^2$ include the (n+1)-valent linking groups having 1 to 20 carbon atoms mentioned above in connection with X in the formula (1), and the like. Among these, hydrocarbon groups obtained by removing (m+1) hydrogen atoms from linear or branched chain-like saturated hydrocarbons having 1 to 8 carbon atoms, chain-like unsaturated hydrocarbon having 2 to 6 carbon atoms, alicyclic hydrocarbons having 5 to 12 carbon atoms, and aromatic hydrocarbons having 6 to 15 carbon atoms, are preferable.

m is preferably 1 or 2, and more preferably 1.

The (m+1)-valent hydrocarbon group having 1 to 20 carbon atoms represented by $R^2$ is preferably a divalent or trivalent chain-like hydrocarbon group or a divalent or trivalent alicyclic hydrocarbon group, and more preferably a divalent chain-like hydrocarbon group or a divalent alicyclic hydrocarbon group.

The divalent hydrocarbon group represented by $R^2$ when m is 1 is preferably a linear or branched divalent chain-like saturated hydrocarbon group having 1 to 8 carbon atoms or a divalent alicyclic hydrocarbon group having 5 to 12 carbon atoms, more preferably a methanediyl group, an ethanediyl group, a propanediyl group, a butanediyl group, a cyclopentanediyl group, a cyclohexanediyl group, a norbornanediyl group, or an adamantanediyl group, still more preferably an ethanediyl group or a propanediyl group, and particularly preferably a propanediyl group.

The trivalent hydrocarbon group represented by $R^2$ when m is 2 is preferably a linear or branched trivalent chain-like saturated hydrocarbon group having 1 to 8 carbon atoms or a trivalent alicyclic hydrocarbon group having 5 to 12 carbon atoms, more preferably a methanetriyl group, an ethanetriyl group, a propanetriyl group, a butanetriyl group, a cyclopentanetriyl group, a cyclohexanetriyl group, a norbornanetriyl group, or an adamantanetriyl group, still more preferably an ethanetriyl group or a propanetriyl group, and particularly preferably a propanetriyl group.

Examples of the monovalent organic group represented by R' include an alkyl group, an alkenyl group, an alkynyl group, an aryl group, an aralkyl group, groups obtained by combining one or more of these groups with an ether group, a carbonyl group, an ester group, an amide group, a urethane group, a urea group, an ether group, a carbonate group, an imino group, or a thioether group, and the like.

Examples of the divalent chain-like hydrocarbon group having 1 to 10 carbon atoms represented by $R^3$ include a methanediyl group, an ethanediyl group, a propanediyl group, a butanediyl group, and the like.

Examples of the divalent alicyclic hydrocarbon group having 4 to 20 carbon atoms represented by $R^3$ include a cyclobutanediyl group, a cyclopentanediyl group, a cyclohexanediyl group, a norbornanediyl group, an adamantanediyl group, and the like.

When $R^4$ in the formula (3) represents a hydrogen atom, the solubility of the polymer (A) in an alkaline developer can be improved.

Examples of the monovalent organic group represented by $R^4$ in the formula (3) include an acid-labile group, an alkali-labile group, and a substituted or unsubstituted hydrocarbon group having 1 to 30 carbon atoms.

The term "acid-labile group" used herein refers to a group that substitutes a hydrogen atom of a polar functional group (e.g., hydroxyl group or carboxyl group), and dissociates in the presence of an acid. The structural unit (III) thus produces a polar group due to an acid. Therefore, when $R^4$ in the formula (3) represents an acid-labile group, an area exposed in an exposure step of a method for forming a resist pattern described later exhibits improved solubility in an alkaline developer.

The term "alkali-labile group" used herein refers to a group that substitutes a hydrogen atom of a polar functional group (e.g., hydroxyl group or carboxyl group), and dissociates in the presence of an alkali (e.g., 2.38 mass % tetramethylammonium hydroxide aqueous solution (23° C.)). The structural unit (III) thus produces a polar group due to an alkali. Therefore, when $R^4$ in the formula (3) represents an alkali-labile group, the solubility in an alkaline developer can be improved, and the hydrophobicity of the surface of the resist film after development can be decreased.

Specific examples of the acid-labile group include a t-butoxycarbonyl group, a tetrahydropyranyl group, a tetrahydrofuranyl group, a (thiotetrahydropyranylsulfanyl)methyl group, a (thiotetrahydrofuranylsulfanyl)methyl group, an alkoxy-substituted methyl group, an alkylsulfanyl-substituted methyl group, and the like. Examples of the alkoxy group (substituent) of the alkoxy-substituted methyl group include alkoxy groups having 1 to 4 carbon atoms.

Examples of the alkyl group (substituent) of the alkylsulfanyl-substituted methyl group include alkyl groups having 1 to 4 carbon atoms. The acid-labile group may be a group shown by a formula (Y-1) described later in connection with the structural unit (IV). Among these, a t-butoxycarbonyl group and an alkoxy-substituted methyl group are preferable when A in the formula (3) represents an oxygen atom or —NR"—. The group shown by the formula (Y-1) described later in connection with the structural unit (IV) is preferable when A in the formula (3) represents —CO—O—.

Specific examples of the alkali-labile group include groups shown by the following formulas (W-1) to (W-4). Among these, the group shown by the formula (W-1) is preferable when A in the formula (3) represents an oxygen atom or —NR"—. The group shown by any of the formulas (W-2) to (W-4) is preferable when A in the formula (3) represents —CO—O—.

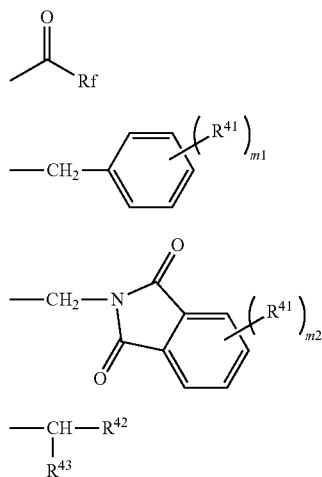

The definition of Rf in the formula (W-1) is the same as that of $R^b$ in the formula (i).

$R^{41}$ in the formulas (W-2) and (W-3) represents a substituent. When a plurality of $R^{41}$ are present, the plurality of $R^{41}$ may be either the same or different. $m_1$ is an integer from 0 to 5, and $m_2$ is an integer from 0 to 4. $R^{42}$ and $R^{43}$ in the formula (W-4) individually represent a hydrogen atom or an alkyl group having 1 to 10 carbon atoms, provided that $R^{42}$ and $R^{43}$ may bond to each other to form an alicyclic hydrocarbon structure having 4 to 20 carbon atoms.

Examples of the substituent represented by $R^{41}$ in the formulas (W-2) and (W-3) include the substituents mentioned above in connection with the linking group X included in the structural unit (I-1).

Examples of the alicyclic hydrocarbon structure formed by $R^{42}$ and $R^{43}$ together with the carbon atom that is bonded to $R^{42}$ and $R^{43}$ include a cyclopentyl group, a cyclopentylmethyl group, a 1-(1-cyclopentylethyl) group, a 1-(2-cyclopentylethyl) group, a cyclohexyl group, a cyclohexylmethyl group, a 1-(1-cyclohexylethyl) group, a 1-(2-cyclohexylethyl) group, a cycloheptyl group, a cycloheptylmethyl group, a 1-(1-cycloheptylethyl) group, a 1-(2-cycloheptylethyl) group, a 2-norbornyl group, and the like.

Specific examples of the group shown by the formula (W-4) include a methyl group, an ethyl group, a 1-propyl group, a 2-propyl group, a 1-butyl group, a 2-butyl group, a 1-pentyl group, a 2-pentyl group, a 3-pentyl group, a 1-(2-methylbutyl) group, a 1-(3-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(3-methylpentyl) group, a 2-(4-methylpentyl) group, a 3-(2-methylpentyl) group, and the like. Among these, a methyl group, an ethyl group, a 1-propyl group, a 2-propyl group, a 1-butyl group, and a 2-butyl group are preferable.

$X^2$ in the formula (3) represents a divalent chain-like hydrocarbon group having 1 to 20 carbon atoms that includes at least one fluorine atom. Specific examples of the divalent chain-like hydrocarbon group represented by $X^2$ include the groups shown by the following formulas (X2-1) to (X2-6).

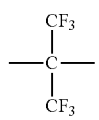

(X2-1)

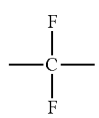

(X2-2)

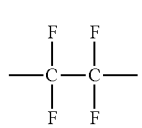

(X2-3)

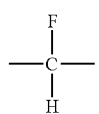

(X2-4)

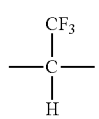

(X2-5)

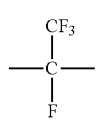

(X2-6)

$X^2$ preferably represents the group shown by the formula (X2-1) when A in the formula (3) represents an oxygen atom. $X^2$ preferably represents the group shown by any of the formulas (X2-2) to (X2-6) (more preferably the group shown by the formula (X2-2)) when A in the formula (3) represents —CO—O—.

Note that m in the formula (3) is an integer from 1 to 3. Therefore, one, two, or three $R^4$ are introduced into the structural unit (III). A plurality of $R^3$, a plurality of $R^4$, a plurality of $X^2$, and a plurality of A may respectively be either the same or different when m is 2 or 3. Specifically, a plurality of $R^4$ may have either the same or different structure when m is 2 or 3. When m is 2 or 3, a plurality of $R^3$ may be bonded to an identical carbon atom included in the hydrocarbon group represented by $R^2$, and may be bonded to different carbon atoms included in the hydrocarbon group represented by $R^2$.

Specific examples of the structural unit (III) include structural units shown by the following formulas (3-1a) to (3-1c).

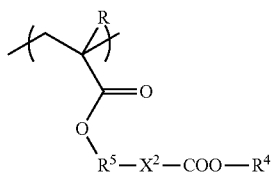
(3-1a)

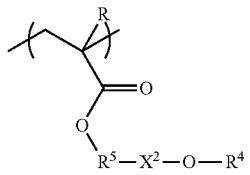
(3-1b)

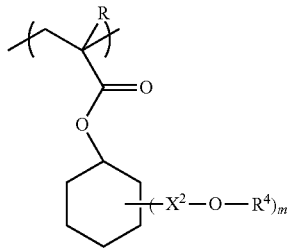
(3-1c)

wherein $R^5$ represents a divalent linear, branched, or cyclic saturated or unsaturated hydrocarbon group having 1 to 20 carbon atoms, and $X^2$, $R^4$, and m are the same as defined for the formula (3), provided that a plurality of $X^2$ and a plurality of $R^4$ may respectively be either the same or different when m is 2 or 3.

Specific examples of a monomer that produces the structural unit (III) include compounds shown by the following formulas (3m-1) to (3m-6).

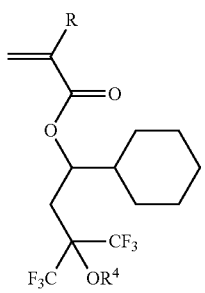
(3m-1)

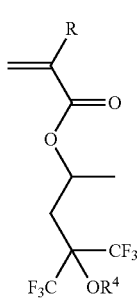
(3m-2)

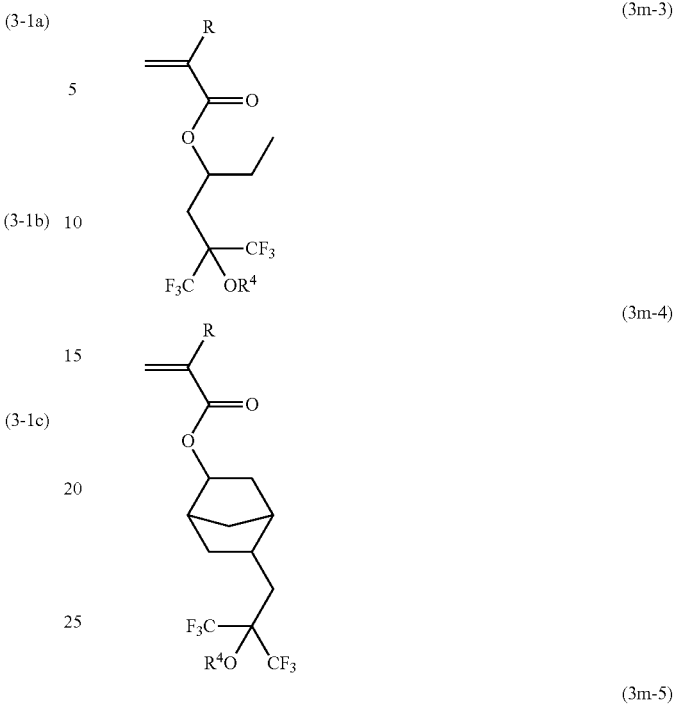

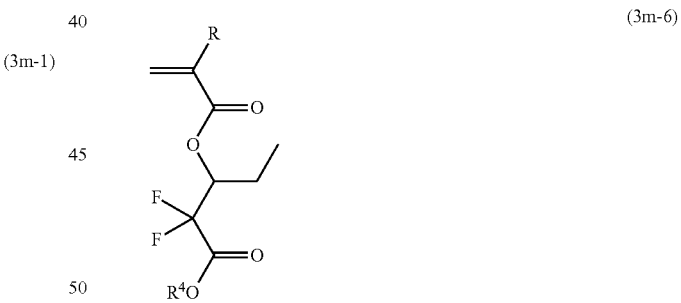

wherein R is the same as defined for the formula (3), and $R^4$ represents (or individually represent) a hydrogen atom or a monovalent organic group.

The content of the structural unit (III) in the polymer (A) is preferably 0 to 90 mol %, more preferably 10 to 85 mol %, and still more preferably 20 to 35 mol %, based on the total structural units included in the polymer (A). If the content of the structural unit (III) is within the above range, the surface of a resist film formed using the radiation-sensitive resin composition has an improved dynamic contact angle during alkali development. The polymer (A) may include only one type of structural unit (III), or may include two or more types of structural unit (III).

If the polymer (A) includes the structural unit (I) and at least one structural unit selected from the group consisting of the structural units (II) and (III), the dynamic contact angle of the surface of a resist film formed using the radiation-sensitive resin composition including the polymer (A) can be further improved, so that the draining capability of the surface of the film during exposure can be further improved.

<Structural Unit (IV)>

The polymer (A) may include the structural unit (IV) shown by the following formula (4).

If the polymer (A) includes the structural unit (IV), the shape of the resist pattern after development can be improved.

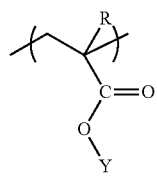

(4)

wherein R represents a hydrogen atom, a methyl group, or a trifluoromethyl group, and Y represents an acid-labile group.

R in the formula (4) preferably represents a methyl group.

The acid-labile group represented by Y in the formula (4) is preferably a group shown by the following formula (Y-1).

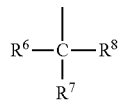

(Y-1)

wherein $R^6$ represents an alkyl group having 1 to 4 carbon atoms or a monovalent alicyclic hydrocarbon group having 4 to 20 carbon atoms, and $R^7$ and $R^8$ individually represent an alkyl group having 1 to 4 carbon atoms or an alicyclic hydrocarbon group having 4 to 20 carbon atoms, or bond to each other to form a divalent alicyclic hydrocarbon group having 4 to 20 carbon atoms together with the carbon atom bonded to $R^7$ and $R^8$.

Examples of the alkyl group having 1 to 4 carbon atoms represented by $R^6$ to $R^8$ in the formula (Y-1) include a methyl group, an ethyl group, an n-propyl group, an i-propyl group, an n-butyl group, a 2-methylpropyl group, a 1-methylpropyl group, a t-butyl group, and the like. Examples of the monovalent alicyclic hydrocarbon group having 4 to 20 carbon atoms or the divalent alicyclic hydrocarbon group having 4 to 20 carbon atoms formed by $R^7$ and $R^8$ together with the carbon atom bonded to $R^7$ and $R^8$ include group having an alicyclic hydrocarbon skeleton such as groups having a bridged skeleton (e.g., adamantane skeleton or norbornane skeleton) or a cycloalkane skeleton (e.g., cyclopentane skeleton or cyclohexane skeleton), and groups obtained by substituting these groups with at least one linear, branched, or cyclic alkyl group having 1 to 10 carbon atoms (e.g., methyl group, ethyl group, n-propyl group, or i-propyl group). Among these, a group having a cycloalkane skeleton is preferable since the shape of the resist pattern after development can be further improved.

Specific examples of the structural unit (IV) include structural units shown by the following formulas (4-1) to (4-4).

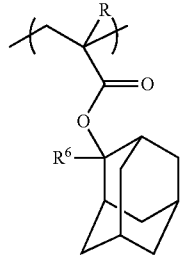

(4-1)

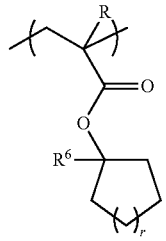

(4-2)

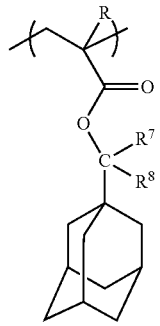

(4-3)

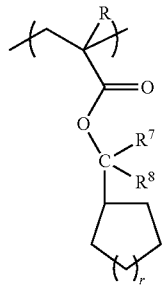

(4-4)

wherein R is the same as defined for the formula (4), $R^6$ to $R^8$ are individually the same as defined for the formula (Y-1), provided that $R^7$ and $R^8$ may bond to each other to form a divalent alicyclic hydrocarbon group having 4 to 20 carbon atoms together with the carbon atom bonded to $R^7$ and $R^8$, and r is an integer from 1 to 3.

The content of the structural unit (IV) in the polymer (A) is preferably 0 to 60 mol %, more preferably 5 to 55 mol %, and still more preferably 10 to 50 mol %, based on the total structural units included in the polymer (A). If the content of the structural unit (IV) is within the above range, the shape of the resist pattern after development can be further improved. The polymer (A) may include only one type of structural unit (IV), or may include two or more types of structural unit (IV).

<Structural Unit (V)>

The polymer (A) may include a structural unit that includes an alkali-soluble group (hereinafter may be referred to as "structural unit (V)"). If the polymer (A) includes the structural unit (V), the polymer (A) exhibits improved affinity for a developer.

The alkali-soluble group included in the structural unit (V) is preferably a functional group that includes a hydrogen atom having a pKa of 4 to 11 from the viewpoint of an improvement in solubility in a developer. Specific examples of such a functional group include functional groups shown by the following formulas (5s-1) and (5s-2).

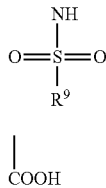

(5s-1)

(5s-2)

wherein $R^9$ represents a hydrocarbon group having 1 to 10 carbon atoms that includes at least one fluorine atom.

The hydrocarbon group having 1 to 10 carbon atoms that includes at least one fluorine atom represented by $R^9$ in the formula (5s-1) is not particularly limited as long as the hydrocarbon group is obtained by substituting some or all of the hydrogen atoms of a hydrocarbon group having 1 to 10 carbon atoms with a fluorine atom. For example, $R^9$ preferably represents a trifluoromethyl group or the like.

A structure for incorporating the structural unit (V) in the polymer (A) is not particularly limited, but is preferably a methacrylate structure, an acrylate structure, an α-trifluoroacrylate structure, or the like.

Specific examples of the structural unit (V) include structural units shown by the following formulas (5-1) and (5-2).

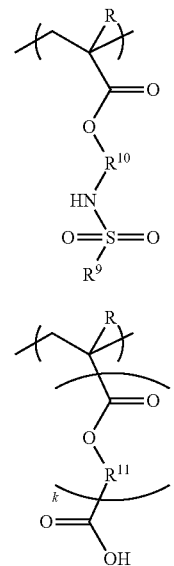

(5-1)

(5-2)

wherein R represents a hydrogen atom, a methyl group, or a trifluoromethyl group, $R^9$ is the same as defined for the formula (5s-1), $R^{10}$ represents a single bond or a divalent linear, branched, or cyclic saturated or unsaturated divalent hydrocarbon group having 1 to 20 carbon atoms, $R^H$ represents a divalent linking group, and k is 0 or 1.

R in the formulas (5-1) and (5-2) preferably represents a methyl group.

Specific examples of the divalent linking group represented by $R^H$ in the formula (5-2) include the divalent linking groups mentioned above in connection with X included in the structural unit (I), and the like.

Specific examples of the structural unit (V) include structural units shown by the following formulas (5-1a), (5-1b), and (5-2a) to (5-2e).

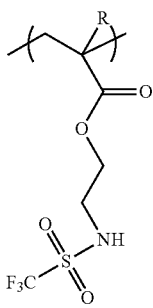

(5-1a)

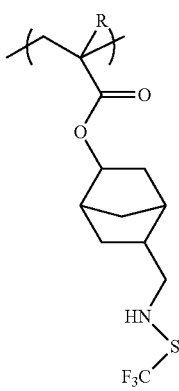

(5-1b)

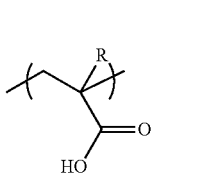

(5-2a)

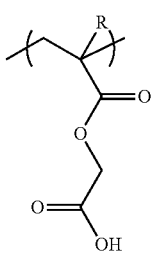

(5-2b)

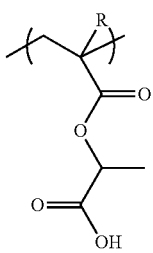

(5-2c)

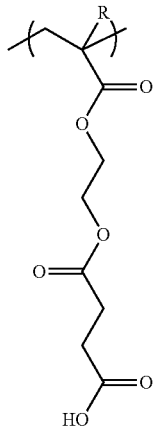

(5-2d)

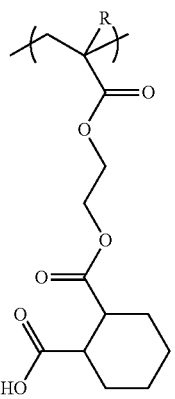

(5-2e)

wherein R represents a hydrogen atom, a methyl group, or a trifluoromethyl group.

The content of the structural unit (V) in the polymer (A) is normally 50 mol % or less, preferably 5 to 30 mol %, and more preferably 5 to 20 mol %, based on the total structural units included in the polymer (A). If the content of the structural unit (V) is within the above range, water repellency during liquid immersion lithography and affinity for a developer during development can be achieved in a well-balanced manner.

<Structural Unit (VI)>

The polymer (A) may include the structural unit (VI) shown by the following formula (6).

If the polymer (A) includes the structural unit (VI), the polymer (A) exhibits improved affinity for a developer.

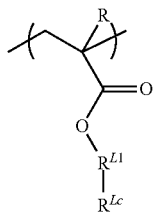

(6)

wherein R represents a hydrogen atom, a methyl group, or a trifluoromethyl group, $R^{L1}$ represents a single bond or a divalent linking group, and $R^{Lc}$ represents a monovalent organic group having a lactone structure or a monovalent organic group having a cyclic carbonate structure.

R in the formula (6) preferably represents a methyl group.

Specific examples of the divalent linking group represented by $R^{L1}$ in the formula (6) include the divalent linking groups mentioned above in connection with X included in the structural unit (I), and the like.

Specific examples of the monovalent organic group having a lactone structure represented by $R^{Lc}$ in the formula (6) include groups shown by the following formulas (Lc-1) to (Lc-6).

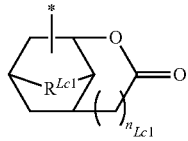

(Lc-1)

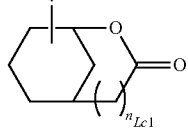

(Lc-2)

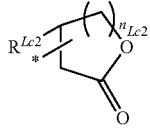

(Lc-3)

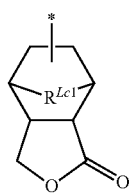

(Lc-4)

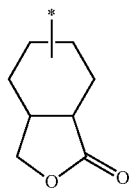

(Lc-5)

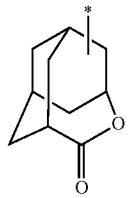

(Lc-6)

wherein $R^{Lc1}$ represents an oxygen atom or a methylene group, $R^{Lc2}$ represents a hydrogen atom or an alkyl group having 1 to 4 carbon atoms, $n_{Lc1}$ is 0 or 1, $n_{Lc2}$ is an integer from 0 to 3, and "*" indicates a bonding site bonded to $R^{L1}$ in the formula (6). Note that the groups shown by the formulas (Lc-1) to (Lc-6) may be substituted with a substituent.

Examples of a substituent that may substitute the groups shown by the formulas (Lc-1) to (Lc-6) include the substituents mentioned above in connection with the linking group X included in the structural unit (I-1).

Specific examples of the structural unit (VI) include the structural units disclosed in paragraphs [0054] to [0057] of Japanese Patent Application Publication (KOKAI) No. 2007-304537, the structural units disclosed in paragraphs [0086] to [0088] of Japanese Patent Application Publication (KOKAI) No. 2008-088343, and structural units shown by the following formulas (6-1a) to (6-1l).
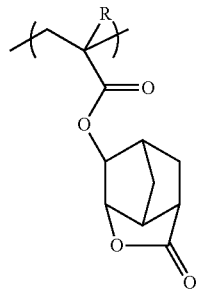
(6-1a)
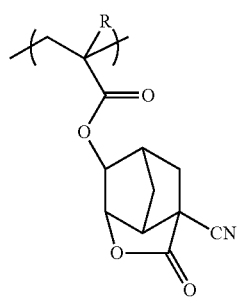
(6-1b)
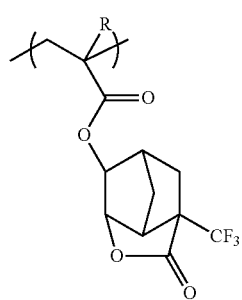
(6-1c)
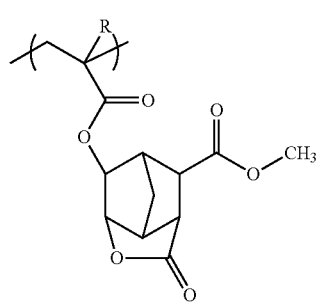
(6-1d)
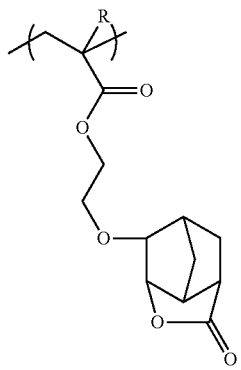
(6-1e)
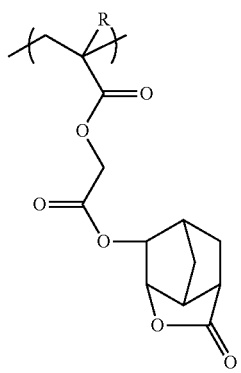
(6-1f)
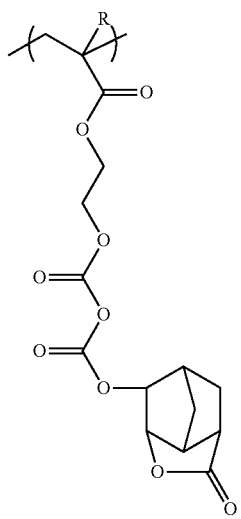
(6-1g)
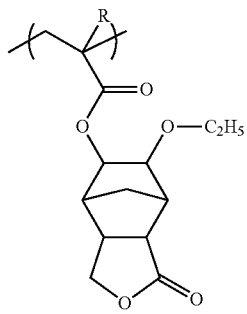
(6-1h)

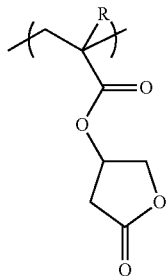 (6-1i)

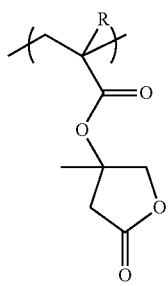 (6-1j)

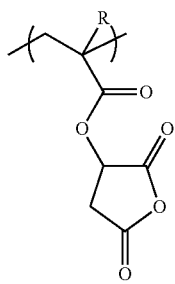 (6-1k)

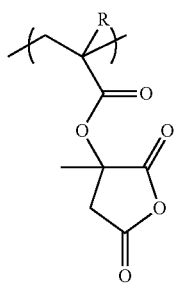 (6-1l)

wherein R represents a hydrogen atom, a methyl group, or a trifluoromethyl group.

These structural units (VI) may be used either individually or in combination. Examples of a preferable monomer that produces the structural unit (VI) include the monomers disclosed in paragraph [0043] of WO2007/116664.

Examples of the structural unit (VI) having a cyclic carbonate structure include a structural unit shown by the following formula (6-2a).

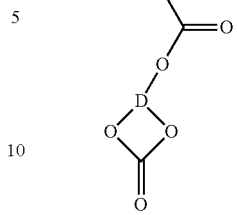 (6-2a)

wherein R is the same as defined for the formula (6), and D represents a trivalent chain-like hydrocarbon group having 1 to 30 carbon atoms, a trivalent alicyclic hydrocarbon group having 3 to 30 carbon atoms, or a trivalent aromatic hydrocarbon group having 6 to 30 carbon atoms. Note that the group represented by D may include an oxygen atom, a carbonyl group, or —NH— in the skeleton, and may be substituted with a substituent.

Examples of a substituent that may substitute the group represented by D include the substituents mentioned above in connection with the linking group X included in the structural unit (I-1).

A monomer that produces the structural unit shown by the formula (6-2a) may be synthesized by the method disclosed in Tetrahedron Letters, Vol. 27, No. 32, p. 3741 (1986), Organic Letters, Vol. 4, No. 15, p. 2561 (2002), or the like.

Examples of a particularly preferable structural unit shown by the formula (6-2a) include structural units shown by the following formulas (X-1) to (6-2a-22).

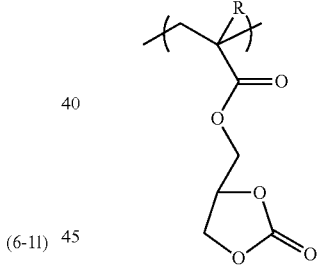 (6-2a-1)

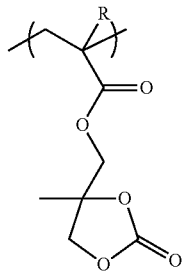 (6-2a-2)

(6-2a-3)
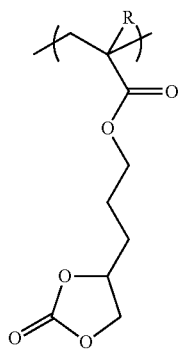
(6-2a-4)
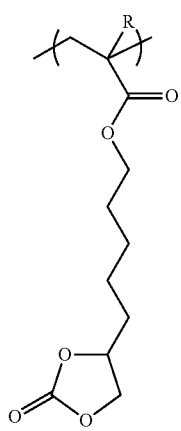
(6-2a-5)
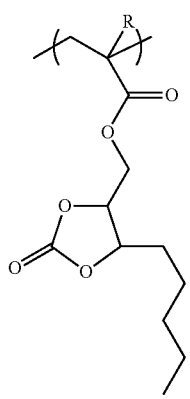
(6-2a-6)
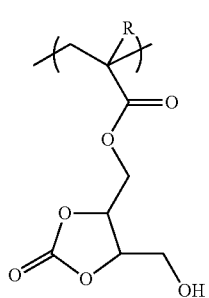
(6-2a-7)
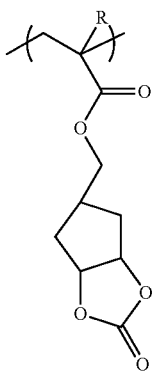
(6-2a-8)
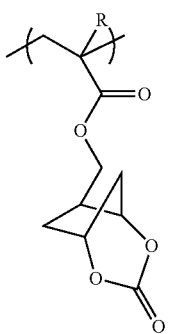
(6-2a-9)
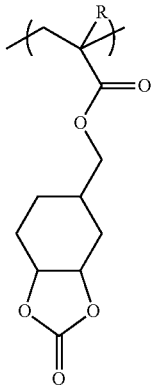
(6-2a-10)
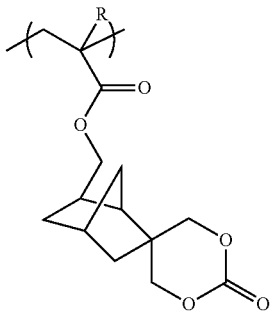

(6-2a-11)
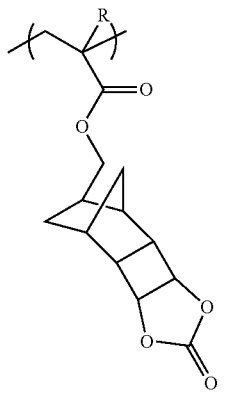
(6-2a-12)
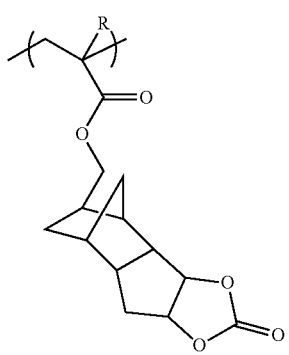
(6-2a-13)
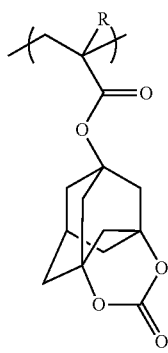
(6-2a-14)
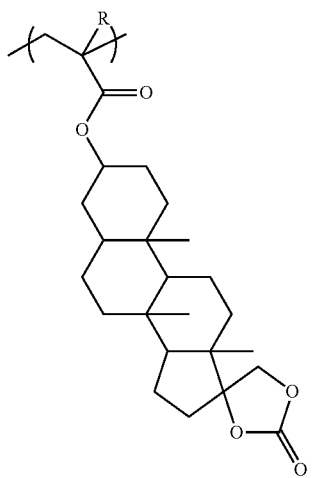
(6-2a-15)
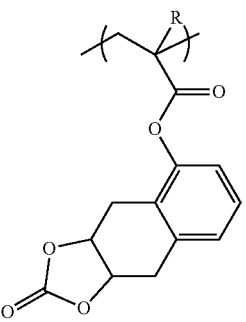
(2-a-16)
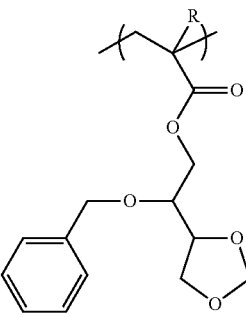
(6-2a-17)
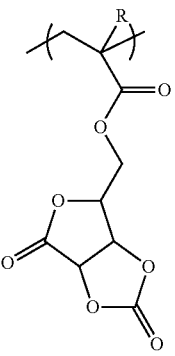
(6-2a-18)
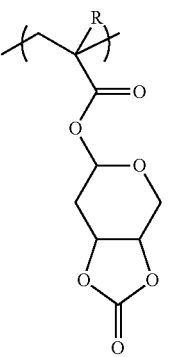

(6-2a-19) 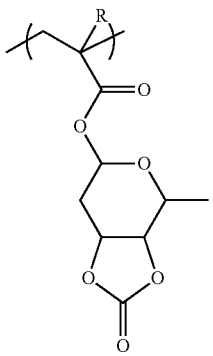

(6-2a-20) 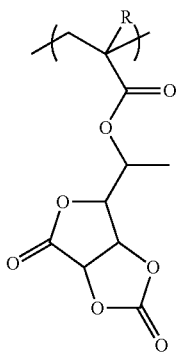

(6-2a-21) 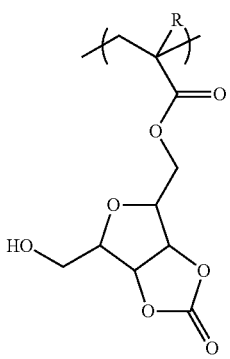

(6-2a-22) 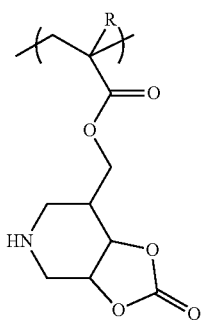

The content of the structural unit (VI) in the polymer (A) is normally 50 mol % or less, preferably 5 to 40 mol %, and more preferably 5 to 20 mol %, based on the total structural units included in the polymer (A). If the content of the structural unit (VI) is within the above range, a high dynamic contact angle during liquid immersion lithography and a sufficient decrease in dynamic contact angle during development can be achieved.

<Structural Unit (VII)>

The polymer (A) may include the structural unit (VII) shown by the following formula (7).

If the polymer (A) includes the structural unit (VII), the polymer (A) exhibits improved affinity for a developer.

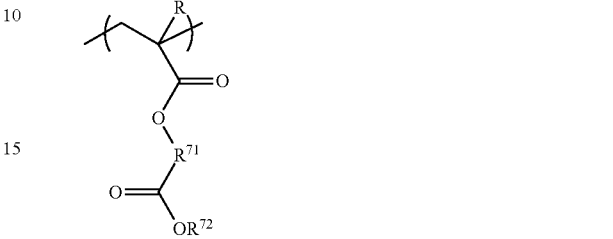

(7)

wherein R represents a hydrogen atom, a methyl group, or a trifluoromethyl group, $R^{71}$ represents a divalent linking group that does not include a fluorine atom, and $R^{72}$ represents an alkali-labile group.

R in the formula (7) preferably represents a methyl group.

Specific examples of the divalent linking group that does not include a fluorine atom represented by $R^{71}$ in the formula (7) include the divalent linking groups that do not include a fluorine atom mentioned above in connection with X included in the structural unit (I).

Examples of the alkali-labile group represented by $R^{72}$ in the formula (7) include the groups shown by the formulas (W-2) to (W-4).

Specific examples of the structural unit (VII) include structural units shown by the following formulas.

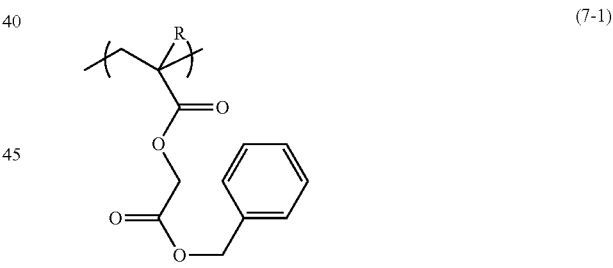

(7-1)

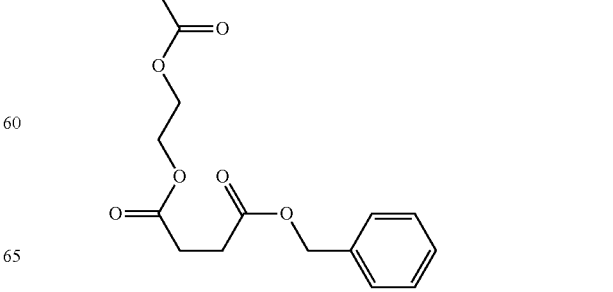

(7-2)

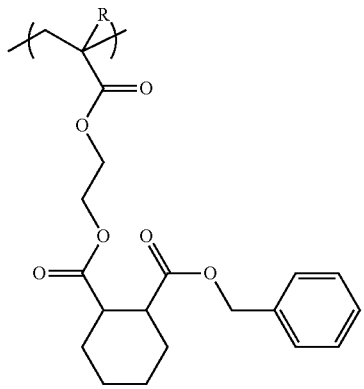

(7-3)

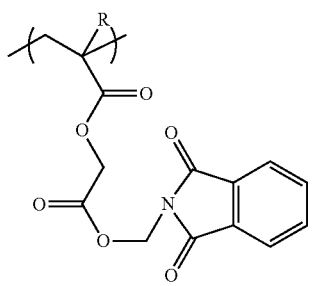

(7-4)

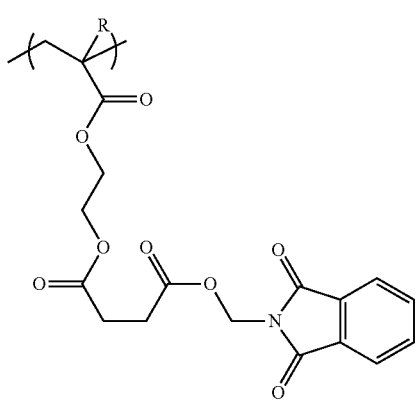

(7-5)

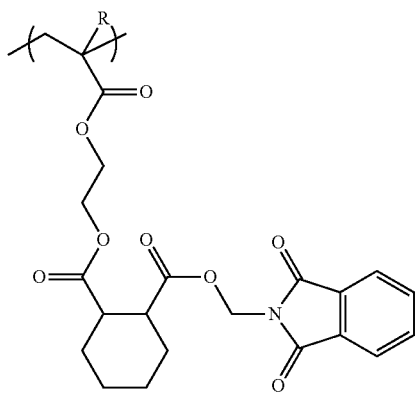

(7-6)

wherein R represents a hydrogen atom, a methyl group, or a trifluoromethyl group.

The content of the structural unit (VII) in the polymer (A) is normally 50 mol % or less, preferably 5 to 40 mol %, and more preferably 5 to 20 mol %, based on the total structural units included in the polymer (A). If the content of the structural unit (VII) is within the above range, a high dynamic contact angle during liquid immersion lithography and a sufficient decrease in dynamic contact angle during development can be achieved.

The content of the polymer (A) in the radiation-sensitive resin composition is preferably 0.1 to 20 mass %, more preferably 0.3 to 10 mass %, and still more preferably 0.5 to 8 mass %, based on the polymers (i.e., the polymer (A) and optional polymers). If the content of the polymer (A) is less than 0.1 mass %, the dynamic contact angle of a resist film formed using the composition may vary. If the content of the polymer (A) exceeds 20 mass %, the difference in solubility of the resist film between the exposed area and the unexposed area may decrease, so that the pattern shape may deteriorate.

<Method of Producing Polymer (A)>

The polymer (A) may be synthesized by radical polymerization or the like. For example, the polymer (A) is preferably synthesized by (1) adding a solution containing a monomer and a radical initiator dropwise to a reaction solvent or a solution containing a monomer to effect polymerization, (2) adding a solution containing a monomer and a solution containing a radical initiator dropwise to a reaction solvent or a solution containing a monomer to effect polymerization, or (3) adding a plurality of solutions respectively containing a monomer and a solution containing a radical initiator dropwise to a reaction solvent or a solution containing a monomer to effect polymerization.

When adding a monomer solution dropwise to another monomer solution, the amount of monomer in the monomer solution that is added dropwise to the other monomer solution is preferably 30 mol % or more, more preferably 50 mol % or more, and particularly preferably 70 mol % or more, based on the total amount of monomer subjected to polymerization.

The reaction temperature may be appropriately determined depending on the type of initiator. The reaction temperature is normally 30 to 150° C., preferably 40 to 150° C., and more preferably 50 to 140° C. The dropwise addition time is adjusted depending on the reaction temperature, the type of initiator, the type of monomer, and the like, but is normally 30 minutes to 8 hours, preferably 45 minutes to 6 hours, and more preferably 1 to 5 hours. The total reaction time including the dropwise addition time is adjusted depending on the above conditions, but is normally 30 minutes to 12 hours, preferably 45 minutes to 12 hours, and more preferably 1 to 10 hours.

Examples of the radical initiator used for polymerization include azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), and dimethyl 2,2'-azobis(2-methylpropionate); peroxide radical initiators such as benzoyl peroxide, t-butyl hydroperoxide, and cumene hydroperoxide; and the like. Among these, dimethyl 2,2'-azobis(2-methylpropionate) is preferable.

These radical initiators may be used either individually or in combination.

A solvent that is other than a solvent that hinders polymerization (e.g., nitrobenzene having a polymerization inhibiting effect or a mercapto compound having a chain transfer effect) and dissolves the monomers may be used as the polymerization solvent. Examples of such a solvent include alcohols, ethers, ketones, amides, ester-lactones, nitriles, a mixture thereof, and the like. These solvents may be used either individually or in combination.

The polymer obtained by polymerization is preferably collected by re-precipitation. Specifically, the polymer solution is poured into a re-precipitation solvent after completion of polymerization to collect the target polymer as a powder. An alcohol, an alkane, and the like may be used as the re-precipitation solvent either individually or in combination. The polymer may also be collected by removing low-molecular-weight components (e.g., monomer and oligomer) by a separation operation, a column operation, ultrafiltration, or the like.

The polystyrene-reduced weight average molecular weight (hereinafter may be referred to as "Mw") of the polymer (A) determined by gel permeation chromatography (GPC) is not particularly limited, but is preferably 1000 to 50,000, more preferably 1000 to 40,000, and particularly preferably 1000 to 30,000. If the Mw of the polymer (A) is less than 1000, a resist film that has a sufficient dynamic contact angle may not be obtained. If the Mw of the polymer (A) exceeds 50,000, the developability of the resulting resist film may deteriorate.

The ratio (Mw/Mn) of the Mw to the polystyrene-reduced number average molecular weight (hereinafter may be referred to as "Mn") of the polymer (A) determined by GPC is normally 1.0 to 5.0, preferably 1.0 to 4.0, and more preferably 1.0 to 2.0.

<Acid Generator (B)>

Examples of the acid generator (B) included in the radiation-sensitive resin composition according to one embodiment of the invention include onium salt compounds (e.g., sulfonium salts and iodonium salts), organic halogen compounds, sulfone compounds (e.g., disulfones and diazomethanesulfones), and the like. The acid generator (B) may be included in the radiation-sensitive resin composition as a compound (described below) and/or an acid-generating group included in the polymer (A), the polymer (C) (described later), or the like.

Examples of a preferable acid generator (B) include the compounds disclosed in paragraphs [0080] to [0113] of Japanese Patent Application Publication (KOKAI) No. 2009-134088, and the like.

Specific examples of a preferable acid generator (B) include diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, triphenylsulfonium trifluoromethanesulfonate, triphenylsulfonium nonafluoro-n-butanesulfonate, triphenylsulfonium perfluoro-n-octanesulfonate, triphenylsulfonium adamantylcarbonyloxy-1,1,2,2-tetrafluoro-n-hexanesulfonate, cyclohexyl.2-oxocyclohexyl.methylsulfonium trifluoromethanesulfonate, dicyclohexyl.2-oxo cyclohexylsulfonium trifluoromethanesulfonate, 2-oxocyclohexyldimethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 4-hydroxy-1-naphthyltetrahydrothiophenium nonafluoro-n-butanesulfonate, 4-hydroxy-1-naphthyltetrahydrothiophenium perfluoro-n-octanesulfonate, 1-(1-naphthylacetomethyl)tetrahydrothiophenium trifluoromethanesulfonate, 1-(1-naphthylacetomethyl)tetrahydrothiophenium nonafluoro-n-butanesulfonate, 1-(1-naphthylacetomethyl)tetrahydrothiophenium perfluoro-n-octanesulfonate, 1-(3,5-dimethyl-4-hydroxyphenyl)tetrahydrothiophenium trifluoromethanesulfonate, 1-(3,5-dimethyl-4-hydroxy phenyl)tetrahydrothiophenium nonafluoro-n-butanesulfonate, 1-(3,5-dimethyl-4-hydroxyphenyl)tetrahydrothiophenium perfluoro-n-octanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, and 1,8-naphthalenedicarboxylic acid imide trifluoromethanesulfonate.

It is preferable to use an onium salt compound (preferably a sulfonium salt, and still more preferably triphenylsulfonium adamantylcarbonyloxy-1,1,2,2-tetrafluoro-n-hexanesulfonate) as the acid generator (B).

These compounds may be used either individually or in combination as the acid generator (B). The acid generator (B) is preferably used in an amount of 0.1 to 30 parts by mass, and more preferably 0.1 to 20 parts by mass, based on 100 parts by mass of the polymers included in the radiation-sensitive resin composition, so that the resulting resist exhibits excellent sensitivity and developability. If the amount of the acid generator is less than 0.1 parts by mass, a decrease in sensitivity and developability may occur. If the amount of the acid generator exceeds 30 parts by mass, a rectangular resist pattern may not be obtained due to a decrease in transparency to radiation.

<Polymer (C)>

The polymer (C) has a fluorine atom content lower than that of the polymer (A), and includes an acid-labile group. The polymer (C) that includes an acid-labile group is insoluble or scarcely soluble in alkali, but becomes alkali-soluble upon dissociation (elimination) of the acid-labile group due to an acid generated by the acid generator (B) or the like. The polymer (C) is a component that serves as a base resin in the radiation-sensitive resin composition according to one embodiment of the invention. The expression "insoluble or scarcely soluble in alkali" means that a film (thickness: 100 nm) that is formed only of the polymer has a thickness equal to or more than 50% of the initial thickness when developed under alkaline development conditions employed when forming a resist pattern using a resist film that is formed of the radiation-sensitive resin composition.

Since the polymer (C) has a fluorine atom content lower than that of the polymer (A), the polymer (A) tends to be unevenly distributed in the surface layer of a resist film formed using the radiation-sensitive resin composition that includes the polymers (C) and (A). Therefore, the polymer (A) more effectively exhibits high hydrophobicity, a high dynamic contact angle, and high solubility in an alkaline developer and a rinse agent. The fluorine atom content (mass %) may be calculated from the $^{13}$C-NMR analysis results for the structure of the polymer.

The structure of the polymer (C) is not particularly limited as long as the polymer (C) has the above properties. It is preferable that the polymer (C) include the structural unit (III) shown by the formula (3) and/or the structural unit (VI) shown by the formula (6).

<Structural Unit (III)>

The content of the structural unit (III) in the polymer (C) is preferably 0 to 30 mol %, and more preferably 0 to 15 mol %, based on the total structural units included in the polymer (C). If the content of the structural unit (III) exceeds 30 mol %, the resulting pattern may peel off due to insufficient adhesion to a substrate.

<Structural Unit (VI)>

The content of the structural unit (VI) in the polymer (C) is preferably 5 to 75 mol %, more preferably 15 to 65 mol %, and still more preferably 25 to 55 mol %, based on the total structural units included in the polymer (C). If the content of the structural unit (VI) is less than 5 mol %, the resulting pattern may peel off due to insufficient adhesion to a substrate. If the content of the structural unit (VI) exceeds 75 mol %, the pattern shape may deteriorate due to a decrease in contrast after dissolution.

<Additional Structural Unit>

The polymer (C) may include an additional structural unit other than the structural units (III) and (VI) as long as the polymer (C) has a fluorine atom content lower than that of the polymer (A). Examples of a polymerizable unsaturated monomer that produces such an additional structural unit include the monomers disclosed in paragraphs [0065] to [0085] of WO2007/116664A.

A structural unit derived from 2-hydroxyethyl(meth)acrylate, 2-hydroxypropyl(meth)acrylate, or 3-hydroxypropyl (meth)acrylate, the structural unit (V), and a structural unit shown by the following formula (o-1) are preferable as the additional structural unit.

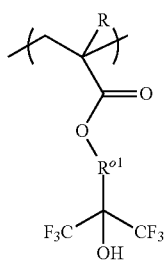

(o-1)

wherein R represents a hydrogen atom, a methyl group, or a trifluoromethyl group, and $R^{o1}$ represents a divalent linking group.

R in the formula (o-1) preferably represents a methyl group.

Specific examples of the divalent linking group represented by $R^{o1}$ in the formula (o-1) include the divalent linking groups mentioned above in connection with X included in the structural unit (I).

Examples of the structural unit shown by the formula (o-1) include structural units shown by the following formulas (o-1a) to (o-1h).

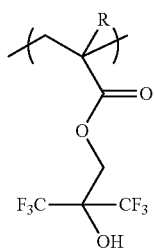

(o-1a)

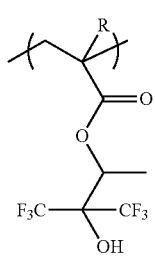

(o-1b)

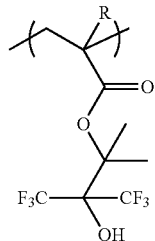

(o-1c)

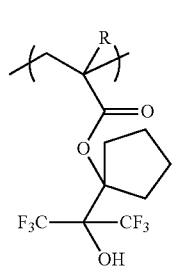

(o-1d)

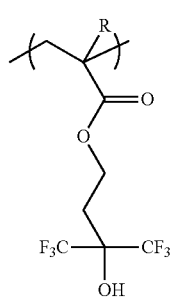

(o-1e)

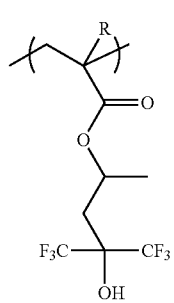

(o-1f)

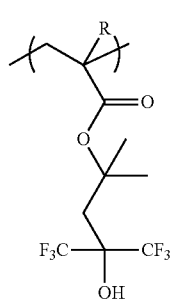

(o-1g)

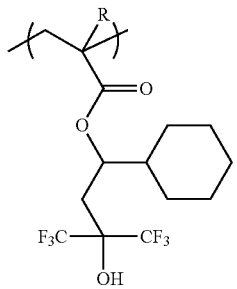

wherein R represents a hydrogen atom, a methyl group, or a trifluoromethyl group.

The Mw of the polymer (C) is normally 3000 to 300,000, preferably 4000 to 200,000, and still more preferably 4000 to 100,000. If the Mw of the polymer (C) is less than 3000, the heat resistance of the resulting resist may deteriorate. If the Mw of the polymer (C) exceeds 300,000, the developability of the resulting resist may deteriorate.

<Acid Diffusion Controller (D)>

The radiation-sensitive resin composition may optionally include an acid diffusion controller as the component (D). Examples of the acid diffusion controller (D) include a compound shown by the following formula (8) (hereinafter referred to as "nitrogen-containing compound (I)"), a compound that includes two nitrogen atoms in one molecule (hereinafter referred to as "nitrogen-containing compound (II)"), a compound that includes three or more nitrogen atoms (hereinafter referred to as "nitrogen-containing compound (III)"), amide group-containing compounds, urea compounds, nitrogen-containing heterocyclic compounds, and the like. The acid diffusion controller improves the pattern shape and the dimensional accuracy of the resulting resist. The acid diffusion controller (D) may be included in the radiation-sensitive resin composition as a compound (described below) and/or an acid diffusion-controlling group included in the polymer (A), the polymer (C), or the like.

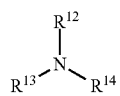

wherein $R^{12}$ to $R^{14}$ individually represent a hydrogen atom, a substituted or unsubstituted linear, branched, or cyclic alkyl group, an aryl group, or an aralkyl group.

Examples of the nitrogen-containing compound (I) include monoalkylamines such as n-hexylamine; dialkylamines such as di-n-butylamine; trialkylamines such as triethylamine; aromatic amines such as aniline; and the like.

Examples of the nitrogen-containing compound (II) include ethylenediamine, N,N,N',N'-tetramethylethylenediamine, and the like.

Examples of the nitrogen-containing compounds (III) include polyethyleneimine, polyallylamine, poly(dimethylaminoethylacrylamide), and the like.

Examples of the amide group-containing compounds include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compounds include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compounds include pyridines such as pyridine and 2-methylpyridine, pyrazine, pyrazole, and the like.

A compound that includes an acid-labile group may also be used as the nitrogen-containing organic compound.

Examples of the nitrogen-containing organic compound that includes an acid-labile group include N-(t-butoxycarbonyl)piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-(t-butoxycarbonyl)-4-hydroxypiperidine, and the like.

A compound shown by the following formula (9) may also be used as the acid diffusion controller.

$$X^+Z^- \qquad (9)$$

wherein $X^+$ represents a cation shown by the following formula (9-1-1) or (9-1-2), and $Z^-$ represents $OH^-$, an anion shown by $R^{D1}\text{—}COO^-$, an anion shown by $R^{D1}\text{—}SO_3^-$, or an anion shown by $R^{D1}\text{—}N^-\text{—}SO_2\text{—}R^{D2}$ (wherein $R^{D1}$ represents a substituted or unsubstituted alkyl group, a substituted or unsubstituted monovalent alicyclic hydrocarbon group, or a substituted or unsubstituted aryl group, and $R^{D2}$ represents an alkyl group in which some or all of the hydrogen atoms are substituted with a fluorine atom, or a monovalent alicyclic hydrocarbon group).

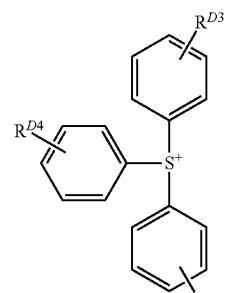

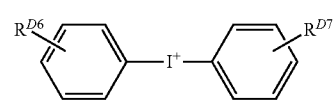

$R^{D3}$ to $R^{D5}$ individually represent a hydrogen atom, an alkyl group, an alkoxy group, a hydroxyl group, or a halogen atom, and $R^{D6}$ and $R^{D7}$ individually represent a hydrogen atom, an alkyl group, an alkoxy group, a hydroxyl group, or a halogen atom.

The above compound is used as an acid diffusion controller that loses acid diffusion controllability upon decomposition due to exposure (hereinafter may be referred to as "photodegradable acid diffusion controller"). The above compound allows diffusion of an acid in the exposed area, but controls diffusion of an acid in the unexposed area, so that the contrast between the exposed area and the unexposed area is improved (i.e., the boundary between the exposed area and the unexposed area becomes distinct). This is effective for reducing the line width roughness (LWR) and the mask error enhancement factor (MEEF) of the radiation-sensitive resin composition.

$X^+$ in the formula (9) represents the cation shown by the formula (9-1-1) or (9-1-2). $R^{D3}$ to $R^{D5}$ in the formula (9-1-1) individually represent a hydrogen atom, an alkyl group, an alkoxy group, a hydroxyl group, or a halogen atom. $R^{D3}$ to $R^{D5}$ preferably represent a hydrogen atom, an alkyl group, an alkoxy group, or a halogen atom since the solubility of the compound in a developer decreases. $R^{D6}$ and $R^{D7}$ in the formula (9-1-2) individually represent a hydrogen atom, an alkyl group, an alkoxy group, a hydroxyl group, or a halogen atom. $R^{D6}$ and $R^{D7}$ preferably represent a hydrogen atom, an alkyl group, or a halogen atom.

$Z^-$ in the formula (9) represents $OH^-$, an anion shown by $R^{D1}$—$COO^-$, an anion shown by $R^{D1}$—$SO_3^-$, or an anion shown by $R^{D1}$—$N^-$—$SO_2$—$R^{D2}$. $R^{D1}$ represents a substituted or unsubstituted alkyl group, a substituted or unsubstituted alicyclic hydrocarbon group, or a substituted or unsubstituted aryl group. $R^{D1}$ preferably represents an alicyclic hydrocarbon group or an aryl group since the solubility of the compound in a developer decreases.

Examples of the substituted or unsubstituted alkyl group represented by $R^{D1}$ include groups that include one or more substituents such as hydroxyalkyl groups having 1 to 4 carbon atoms such as a hydroxymethyl group; alkoxy group groups having 1 to 4 carbon atoms such as a methoxy group; a cyano group; and cyanoalkyl groups having 2 to 5 carbon atoms such as a cyanomethyl group. Among these, a hydroxymethyl group, a cyano group, and a cyanomethyl group are preferable.

Examples of the substituted or unsubstituted alicyclic hydrocarbon group represented by $R^{D1}$ include monovalent groups derived from an alicyclic hydrocarbon such as a cycloalkane skeleton (e.g., hydroxycyclopentane, hydroxycyclohexane, or cyclohexanone), or a bridged alicyclic hydrocarbon skeleton (e.g., 1,7,7-trimethylbicyclo[2.2.1]heptan-2-one (camphor)). Among these, a group derived from 1,7,7-trimethylbicyclo[2.2.1]heptan-2-one is preferable.

Examples of the substituted or unsubstituted aryl group represented by $R^{D1}$ include a phenyl group, a benzyl group, a phenylethyl group, a phenylpropyl group, a phenylcyclohexyl group, and groups obtained by substituting these groups (compounds) with a hydroxyl group, a cyano group, or the like. Among these, a phenyl group, a benzyl group, and a phenylcyclohexyl group are preferable.

$Z^-$ in the formula (9) preferably represents the anion shown by the following formula (9-2-1) (i.e., an anion shown by $R^{D1}$—$COO^-$ wherein $R^{D1}$ represents a phenyl group), the anion shown by the following formula (9-2-2) (i.e., an anion shown by $R^{D1}$—$SO_3^-$ wherein $R^{D1}$ represents a group derived from 1,7,7-trimethylbicyclo[2.2.1]heptan-2-one), or the anion shown by the following formula (9-2-3) (i.e., an anion shown by $R^{D1}$—$N^-$—$SO_2$—$R^{D2}$ wherein $R^{D1}$ represents a butyl group, and $R^{D2}$ represents a trifluoromethyl group).

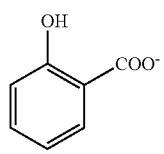

(9-2-1)

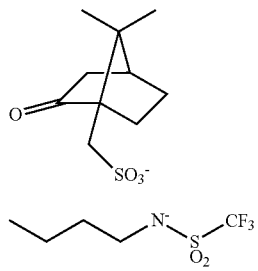

Examples of the photodegradable acid diffusion controller shown by the formula (9) include sulfonium salt compounds, iodonium salt compounds, and the like that satisfy the above conditions.

Examples of the sulfonium salt compounds include triphenylsulfonium hydroxide, triphenylsulfonium salicylate, triphenylsulfonium 4-trifluoromethyl salicylate, diphenyl-4-hydroxyphenylsulfonium salicylate, triphenylsulfonium 10-camphorsulfonate, 4-t-butoxyphenyl.diphenylsulfonium 10-camphorsulfonate, and the like.

These sulfonium salt compounds may be used either individually or in combination.

Examples of the iodonium salt compounds include bis(4-t-butylphenyl)iodonium hydroxide, bis(4-t-butylphenyl)iodonium salicylate, bis(4-t-butylphenyl)iodonium 4-trifluoromethyl salicylate, bis(4-t-butylphenyl)iodonium 10-camphorsulfonate, and the like. These iodonium salt compounds may be used either individually or in combination.

These acid diffusion controllers (D) may be used either individually or in combination. The acid diffusion controller (D) is preferably used in an amount of 10 parts by mass or less, and more preferably 5 parts by mass or less, based on 100 parts by mass of the polymers included in the radiation-sensitive resin composition.

If the amount of the acid diffusion controller (D) is too large, the sensitivity of the resulting resist film may unduly decrease.

<Solvent (E)>

The radiation-sensitive resin composition according to one embodiment of the invention normally includes a solvent. The solvent is not particularly limited as long as at least the polymer (A), the acid generator (B), the optional polymer (C), and the like can be dissolved therein. Examples of the solvent (E) include linear or branched ketones; cyclic ketones; propylene glycol monoalkyl ether acetates; alkyl 2-hydroxypropionates; alkyl 3-alkoxypropionates; and the like.

Among these, linear or branched ketones, cyclic ketones, and propylene glycol monoalkyl ether acetates are preferable, and propylene glycol monomethyl ether acetate and cyclohexanone are more preferable. These solvents may be used either individually or in combination.

<Additive (F)>

The radiation-sensitive resin composition according to the invention may optionally include an uneven distribution promoter, a surfactant, an alicyclic compound, a sensitizer, a crosslinking agent, and the like as the additive (F).

(Uneven Distribution Promoter)

The uneven distribution promoter causes the polymer (A) to be more efficiently unevenly distributed over the surface of the resist film. The amount of the polymer (A) added to the radiation-sensitive resin composition can be reduced by adding the uneven distribution promoter to the radiation-sensitive resin composition. This makes it possible to further suppress elution of components from the resist film to an immersion liquid, or implement high-speed liquid immersion lithography via a high-speed scan without impairing the basic resist performance (e.g., LWR, development defect resistance, and pattern collapse resistance), so that the hydrophobicity of the surface of the resist film that suppresses defects (e.g., watermark defects) that may occur due to liquid immersion lithography can be improved. Examples of the uneven distribution promoter include a low-molecular-weight compound having a relative dielectric constant of 30 to 200 and a boiling point at 1 atmosphere of 100° C. or more. Examples of such a compound include lactone compounds, carbonate compounds, nitrile compounds, polyhydric alcohols, and the like.

Specific examples of lactone compounds include γ-butyrolactone, valerolactone, mevalonic lactone, norbornane lactone, and the like.

Specific examples of carbonate compounds include propylene carbonate, ethylene carbonate, butylene carbonate, vinylene carbonate, and the like.

Specific examples of nitrile compounds include succinonitrile and the like. Specific examples of polyhydric alcohols include glycerol and the like.

The uneven distribution promoter is normally added to the radiation-sensitive resin composition according to one embodiment of the invention in an amount of 0 to 1000 parts by mass, preferably 10 to 500 parts by mass, and more preferably 30 to 300 parts by mass, based on 100 parts by mass of the polymers. These uneven distribution promoters may be used either individually or in combination.

(Surfactant)

The surfactant improves the applicability, the developability, and the like of the radiation-sensitive resin composition. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, and the like. Examples of commercially available surfactants include KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination. The surfactant is normally used in an amount of 2 parts by mass or less based on 100 parts by mass of the polymers included in the radiation-sensitive resin composition.

(Alicyclic Skeleton-Containing Compound)

The alicyclic skeleton-containing compound further improves the dry etching resistance, the pattern shape, adhesion to a substrate, and the like. Examples of the alicyclic skeleton-containing compound include adamantane derivatives such as 1-adamantanecarboxylic acid, 2-adamantanone, and t-butyl 1-adamantanecarboxylate; deoxycholates such as t-butyl deoxycholate, t-butoxycarbonylmethyl deoxycholate, and 2-ethoxyethyl deoxycholate; lithocholates such as t-butyl lithocholate, t-butoxycarbonylmethyl lithocholate, and 2-ethoxyethyl lithocholate; 3-[2-hydroxy-2,2-bis(trifluoromethyl)ethyl]tetracyclo[4.4.0.1$^{2,5}$.1$^{7,10}$]dodecane; 2-hydroxy-9-methoxycarbonyl-5-oxo-4-oxatricyclo[4.2.1.0$^{3,7}$]nonane; and the like. These alicyclic skeleton-containing compounds may be used either individually or in combination. The alicyclic skeleton-containing compound is normally used in an amount of 50 parts by mass or less, and preferably 30 parts by mass or less, based on 100 parts by mass of the polymers included in the radiation-sensitive resin composition.

(Sensitizer)

The sensitizer absorbs energy other than the energy of radiation absorbed by the acid generator (B), and transmits the energy to the acid generator (B) as electrons and radicals to increase the amount of acid to be generated. The sensitizer thus improves the apparent sensitivity of the radiation-sensitive resin composition.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination.

(Crosslinking Agent)

When using the radiation-sensitive resin composition according to the invention as a negative-tone radiation-sensitive resin composition, the radiation-sensitive resin composition may include a compound (hereinafter referred to as "crosslinking agent") that crosslinks an alkaline developer-soluble polymer in the presence of an acid. Examples of the crosslinking agent include a compound that includes at least one functional group (hereinafter referred to as "crosslinkable functional group") that exhibits crosslinking reactivity with an alkaline developer-soluble polymer.

Examples of the crosslinkable functional group include a glycidyl ether group, a glycidyl ester group, a glycidyl amino group, a methoxymethyl group, an ethoxymethyl group, a benzyloxymethyl group, an acetoxymethyl group, a benzoiloxymethyl group, a formyl group, an acetyl group, a vinyl group, an isopropenyl group, a (dimethylamino)methyl group, a (diethylamino)methyl group, a (dimethylolamino) methyl group, a (diethylolamino)methyl group, a morpholinomethyl group, and the like.

Examples of the crosslinking agent include the crosslinking agents disclosed in paragraphs [0169] to [0172] of WO2009/51088.

A methoxymethyl group-containing compound (e.g., dimethoxymethylurea or tetramethoxy methyl glycoluril) is particularly preferable as the crosslinking agent. The negative-tone radiation-sensitive resin composition may include only one type of crosslinking agent, or may include two or more types of crosslinking agent.

The crosslinking agent is preferably used in an amount of 5 to 95 parts by mass, more preferably 15 to 85 parts by mass, and particularly preferably 20 to 75 parts by mass, based on 100 parts by mass of the alkaline developer-soluble polymer. If the amount of the crosslinking agent is less than 5 parts by mass, the residual ratio may decrease, or the resulting pattern may be curved or may swell, for example. If the amount of the crosslinking agent exceeds 95 parts by mass, the alkali developability of the composition may decrease.

A dye, a pigment, an adhesion improver, and the like may also be used as the additive (F). For example, a dye or a pigment visualizes the latent image in the exposed area, and reduces the effect of halation during exposure. An adhesion improver improves adhesion to a substrate. Examples of other additives include an alkali-soluble resin, a low-molecular-weight alkali-solubility controller that includes an acid-labile protecting group, a halation inhibitor, a preservation stabilizer, an anti-foaming agent, and the like.

These additives (F) may be used either individually or in combination.

<Preparation of Radiation-Sensitive Resin Composition Solution>

The radiation-sensitive resin composition according to one embodiment of the invention is normally prepared as a composition solution by dissolving the components in a solvent so that the total solid content is 1 to 50 mass %, and preferably 3 to 25 mass %, and filtering the solution through a filter having a pore size of about 0.2 μm, for example.

It is preferable that the radiation-sensitive resin composition have an impurity (e.g., halogen ions and metals) content as low as possible. The sensitivity, the resolution, the process stability, the pattern shape, and the like of the resist film can be further improved by reducing the impurity content. Therefore, the polymer (e.g., polymers (A) and (C)) included in the radiation-sensitive resin composition is preferably purified by chemical purification (e.g., washing with water or liquid-liquid extraction) or a combination of chemical purification and physical purification (e.g., ultrafiltration or centrifugation).

<Method for Forming Photoresist Pattern>

A method for forming a photoresist pattern according to one embodiment of the invention includes (1) a step of forming a photoresist film on a substrate using the radiation-sensitive resin composition (hereinafter may be referred to as "step (1)"), (2) a step of subjecting the photoresist film to liquid immersion lithography via an immersion liquid provided over the photoresist film (hereinafter may be referred to as "step (2)"), and (3) a step of developing the photoresist film subjected to liquid immersion lithography to form a resist pattern (hereinafter may be referred to as "step (3)"). According to the method for forming a resist pattern, the process time can be reduced by high-speed scan exposure since the surface of the film has a high draining capability. Moreover, an excellent resist pattern can be efficiently formed by suppressing occurrence of development defects.

In the step (1), a photoresist film is formed by applying the radiation-sensitive composition solution according to one embodiment of the invention to a substrate (e.g., silicon wafer or aluminum-coated wafer) by an appropriate coating method (e.g., rotational coating, cast coating, or roll coating). Specifically, the radiation-sensitive resin composition solution is applied so that the resulting resist film has a given thickness, and prebaked (PB) to volatilize the solvent from the film. A resist film is thus formed.

The thickness of the resist film is not particularly limited, but is preferably 10 to 5000 nm, and more preferably 10 to 2000 nm.

The prebaking temperature is determined depending on the composition of the radiation-sensitive resin composition, but is preferably about 30 to 200° C., and more preferably 50 to 150° C. The prebaking time is normally 5 to 600 seconds, and preferably 10 to 300 seconds.

In the step (2), radiation is applied to the photoresist film formed by the step (1) via an immersion liquid provided over the photoresist film (i.e., the photoresist film is subjected to liquid immersion lithography).

Purified water, a long-chain or cyclic aliphatic compound, or the like may be used as the immersion liquid.

As radiation used for exposure, visible rays, ultraviolet rays, deep ultraviolet rays, X-rays, electron beams, or the like may be appropriately selected depending on the type of acid generator. It is preferable to use deep ultraviolet rays such as ArF excimer laser light (wavelength: 193 nm) or KrF excimer laser light (wavelength: 248 nm). It is particularly preferable to use ArF excimer laser light (wavelength: 193 nm).

The exposure conditions (e.g., dose) may be appropriately selected depending on the composition of the radiation-sensitive resin composition, the type of additive, and the like.

It is preferable to perform post-exposure bake (PEB). The acid-labile group included in the resin component smoothly dissociates due to PEB. The PEB temperature may be appropriately adjusted depending on the composition of the radiation-sensitive resin composition, but is normally 30 to 200° C., and preferably 50 to 170° C. The PEB time is normally 5 to 600 seconds, and preferably 10 to 300 seconds.

In order to maximize the performance of the radiation-sensitive resin composition, an organic or inorganic antireflective film may be formed on the substrate, as disclosed in Japanese Examined Patent Publication (KOKOKU) No. 6-12452 (Japanese Patent Application Publication (KOKAI) No. 59-93448), for example. A protective film may be formed on the photoresist film (see Japanese Patent Application Publication (KOKAI) No. 5-188598, for example) in order to prevent an adverse effect of basic impurities and the like contained in the environmental atmosphere. In order to prevent outflow of the acid generator and the like from the photoresist film during liquid immersion lithography, a liquid immersion lithography protective film may be formed on the photoresist film, as disclosed in Japanese Patent Application Publication (KOKAI) No. 2005-352384, for example. These techniques may be used in combination.

When using the method for forming a resist pattern that utilizes liquid immersion lithography, a resist pattern can be formed only of the photoresist film obtained using the radiation-sensitive resin composition according to the invention without forming a protective film (upper-layer film) on the photoresist film. In this case, the throughput is expected to be improved since it is unnecessary to form a protective film (upper-layer film).

In the step (3), the resist film subjected to liquid immersion lithography is developed to form a given resist pattern.

Examples of a developer used in the development step include an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water, and the like. It is preferable to use a TMAH aqueous solution.

The concentration of the alkaline aqueous solution is preferably 10 mass % or less. If the concentration of the alkaline aqueous solution exceeds 10 mass %, the unexposed area may be dissolved in the developer.

An organic solvent may be added to the alkaline aqueous solution (developer).

Examples of the organic solvent include ketones such as acetone, methyl ethyl ketone, methyl i-butyl ketone, cyclopentanone, cyclohexanone, 3-methylcyclopentanone, and 2,6-dimethylcyclohexanone, alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol, ethers such as tetrahydrofuran and dioxane, esters such as ethyl acetate, n-butyl acetate, and i-amyl acetate, aromatic hydrocarbons such as toluene and xylene, phenol, acetonylacetone, dimethylformamide, and the like.

These organic solvents may be used either individually or in combination.

The organic solvent is preferably used in an amount of 100 parts by volume or less based on 100 parts by volume of the alkaline aqueous solution. If the amount of the organic solvent exceeds 100 parts by volume, the exposed area may remain undeveloped due to a decrease in developability.

An appropriate amount of a surfactant or the like may also be added to the alkaline aqueous solution (developer).

After developing the resist film using the alkaline aqueous solution (developer), the resulting resist pattern is washed with a rinse agent, and then dried. Examples of the rinse agent include water such as distilled water and ultrapure water; lower alcohols such as methanol, ethanol, and isopropanol; and the like. These rinse agents may be used either individually or in combination. The rinse agent may include a surfactant.

When forming a resist pattern as described above using the radiation-sensitive resin composition according to one embodiment of the invention, a decrease in film performance due to elution from the resist film, and occurrence of defects (e.g., watermark defects and development defects) can be suppressed (i.e., an excellent patterning capability can be achieved). Therefore, the resist pattern may suitably be used for microfabrication that utilizes lithographic technology.

The invention is further described below by way of examples. Note that the invention is not limited to the following examples. In the examples and comparative examples, the unit "parts" refers to "parts by mass", and the unit "%" refers to "mass %" unless otherwise specified. The property values were measured by the following methods.

[Weight Average Molecular Weight (Mw) and Number Average Molecular Weight (Mn)]

The weight average molecular weight (Mw) and the number average molecular weight (Mn) were measured by gel permeation chromatography (GPC) using GPC columns manufactured by Tosoh Corporation (G2000HXL×2, G3000HXL×1, G4000HXL×1) (flow rate: 1.0 ml/min, eluant: tetrahydrofuran, column temperature: 40° C., standard: monodisperse polystyrene).

[$^1$H-NMR Analysis and $^{13}$C-NMR Analysis]

The $^1$H-NMR analysis of the compound and the $^{13}$C-NMR analysis for determining the fluorine atom content (mass %) in the polymer were performed using a nuclear magnetic resonance spectrometer ("JNM-ECX400" manufactured by JEOL Ltd.).

<Synthesis of Monomer Compound>

Synthesis Example 1

Synthesis of Alkali-Soluble Monomer (M-1)

The compound shown by the following formula (a1) was synthesized by the following method.

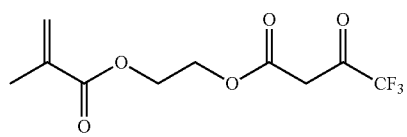

(a1)

A flask equipped with a dropping funnel was charged with 27.7 g of ethylene glycol, 0.570 g of p-toluenesulfonic acid monohydrate, and 200 ml of dichloromethane. The mixture was stirred for 15 minutes in an ice bath. A solution prepared by dissolving 25.0 g of 3,4-dihydro-2H-pyran in 30 ml of dichloromethane was added dropwise to the mixture over 15 minutes. After the dropwise addition, the mixture was stirred for 15 minutes in an ice bath, and then stirred at room temperature for 90 minutes. After the addition of 50 ml of a saturated sodium hydrogen carbonate aqueous solution, the organic layer was washed twice with water (50 ml), washed once with a saturated salt solution (50 ml), and then collected. Low-boiling-point components were evaporated under reduced pressure to obtain a crude product. The crude product was purified by silica gel column chromatography to obtain a compound shown by the following formula (a2) (35.2 g, yield: 81%).

The $^1$H-NMR data for the compound shown by the formula (a2) is given below.

$^1$H-NMR (δ ppm (CD$_3$OD): 1.56 (4H), 1.81 (2H), 2.87 (1H), 3.53 (1H), 3.74 (4H), 3.91 (1H), 4.57 (1H))

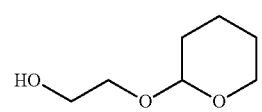

(a2)

A three-necked flask (1000 ml) equipped with a thermometer and a reflux condenser was charged with 17.9 g of the compound shown by the formula (a2), 15.0 g of ethyl trifluoroacetoacetate, 9.96 g of N,N-dimethylaminopyridine, and 600 ml of toluene. The mixture was heated to 110° C. with stirring, and stirred for 3 hours while evaporating low-boiling-point components. The reaction solution was then cooled to room temperature, washed three times with 100 ml of a 1 M hydrochloric acid aqueous solution, and washed once with 100 ml of a saturated salt solution, and the organic layer was collected. Low-boiling-point components were evaporated under reduced pressure to obtain a crude product. The crude product was purified by silica gel column chromatography to obtain a compound shown by the following formula (a3) (11.8 g, yield: 51%).

The $^1$H-NMR data for the compound shown by the formula (a3) is given below.

$^1$H-NMR (δ ppm (CD$_3$OD): 1.55-1.81 (6H), 2.86 (1H), 3.52 (1H), 3.70 (1H), 3.85 (1H), 3.95 (1H), 4.40 (2H), 4.64 (1H), 4.87 (1H))

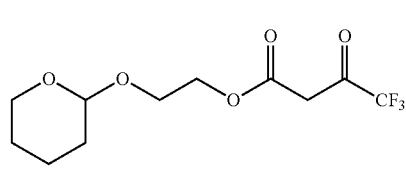

(a3)

A flask (1000 ml) was charged with 20.0 g of the compound shown by the formula (a3), 0.27 g of toluenesulfonic acid monohydrate, and 300 ml of methanol. The mixture was stirred at room temperature for 3 hours. Low-boiling-point components were then evaporated under reduced pressure to obtain a crude product of a compound shown by the following formula (a4) (11.0 g, yield: 78%). The crude product was subjected to the subsequent reaction without purification.

(a4)
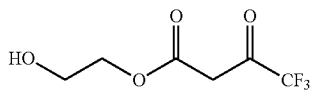

A three-necked flask (500 ml) equipped with a thermometer and a dropping funnel was charged with 11.00 g of the compound shown by the formula (a4), 8.34 g of triethylamine, and 300 ml of THF. The mixture was stirred for 15 minutes in an ice bath. A solution prepared by dissolving 6.90 g of methacrylic chloride in 30 ml of THF was added dropwise to the mixture over 15 minutes. After the dropwise addition, the mixture was stirred for 30 minutes in an ice bath, and then stirred at room temperature for 2 hours, followed by the addition of 5 ml of a 1 M hydrochloric acid aqueous solution. After evaporating THF under reduced pressure, 300 ml of ethyl acetate was added to the mixture. The solution was washed three times with 50 ml of a 1 M hydrochloric acid aqueous solution, and washed once with 50 ml of a saturated salt solution, and the oil layer was collected. Low-boiling-point components were evaporated under reduced pressure to obtain a crude product. The crude product was purified by silica gel column chromatography to obtain the compound shown by the formula (a1) (13.2 g, yield: 70% (based on the compound shown by the formula (a3)).

The compound shown by the following formula (a1) is hereinafter referred to as "compound (M-1)".

The $^1$H-NMR data for the compound (M-1) is given below.

$^1$H-NMR (δ ppm (CD$_3$OD): 1.96 (1H), 2.05 (3H), 3.83 (2H), 4.29 (2H), 5.85 (1H), 6.35 (1H), 6.43 (1H))

<Production of Polymer>

Polymers (A-1) to (A-6), (a-1) to (a-6), and (C-1) were produced using the compounds (M-1) to (M-13) shown by the following formulas.

(M-1)
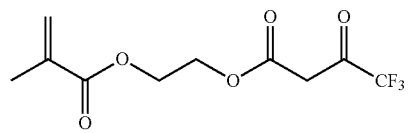

(M-2)
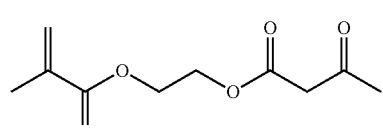

(M-3)
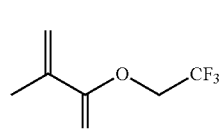

(M-4)
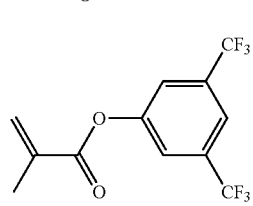

(M-5)
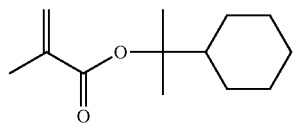

(M-6)
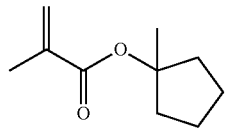

(M-7)
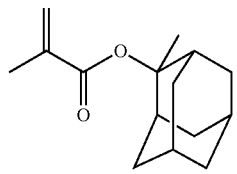

(M-8)
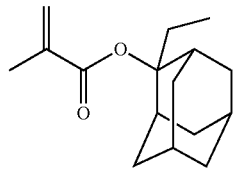

(M-9)
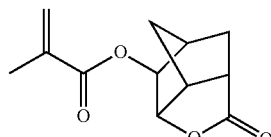

(M-10)
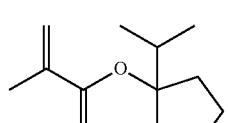

(M-11)
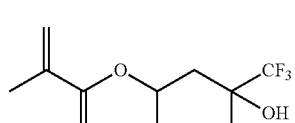

(M-12)
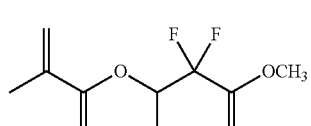

(M-13)
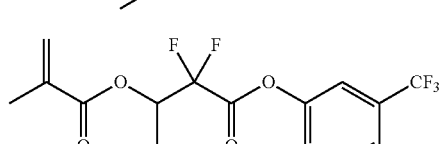

Synthesis Example 2

Production of Polymer (A-1)

A flask (50 ml) equipped with a thermometer and a reflux condenser was charged with 5.0 g of the compound (M-1), 0.15 g of azobisisobutyronitrile, and 15 g of 2-butanone. The mixture was stirred at 80° C. for 3 hours under a nitrogen atmosphere to effect polymerization.

After completion of polymerization, the polymer solution was cooled with water to 30° C. or less, and poured into 75 g of a solution of methanol and water (=8:2) to precipitate the polymer. After removing the supernatant liquid, 15 g of methanol was added to the mixture to wash the precipitated polymer. After removing the supernatant liquid, the polymer was dried at 50° C. for 17 hours to obtain a polymer (A-1) (i.e., a polymer of the compound (M-1)) (3.2 g, yield: 64%). The polymer had an Mw of 10,800 and an Mw/Mn ratio of 1.91. As a result of $^{13}$C-NMR analysis, it was found that the content of structural units derived from the compound (M-1) in the polymer was 100 mol %, and the fluorine atom content in the polymer was 21.3 mass %.

Example 1

Production of Polymer (A-2)

A three-necked flask (50 ml) equipped with a thermometer and a reflux condenser was charged with 3.74 g (30 mol %) of the compound (M-1), 2.35 g (30 mol %) of the compound (M-3), 3.91 g (40 mol %) of the compound (M-5), 0.382 g of azobisisobutyronitrile, and 30 g of 2-butanone. The mixture was stirred at 80° C. for 3 hours.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (A-2) (i.e., a copolymer of the compounds (M-1), (M-3), and (M-5)) (6.4 g, yield: 64%). The copolymer had an Mw of 9420 and an Mw/Mn ratio of 1.72. As a result of $^{13}$C-NMR analysis, it was found that the ratio of the content of structural units derived from the compound (M-1), the content of structural units derived from the compound (M-4), and the content of structural units derived from the compound (M-5) in the copolymer was 32:28:40 (mol %), and the fluorine atom content in the copolymer was 15.9 mass %.

Synthesis Example 3

Production of Polymer (A-3)

A three-necked flask (50 ml) equipped with a thermometer and a reflux condenser was charged with 3.21 g (30 mol %) of the compound (M-1), 3.53 g (30 mol %) of the compound (M-4), 3.29 g (40 mol %) of the compound (M-5), 0.323 g of azobisisobutyronitrile, and 30 g of 2-butanone. The mixture was stirred at 80° C. for 3 hours.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (A-3) (i.e., a copolymer of the compounds (M-1), (M-4), and (M-5)) (6.8 g, yield: 68%). The copolymer had an Mw of 10,200, an Mw/Mn ratio of 1.72, and a fluorine atom content of 20.2 mass %.

Example 2

Production of Polymer (A-4)

A three-necked flask (50 ml) equipped with a thermometer and a reflux condenser was charged with 3.25 g (30 mol %) of the compound (M-1), 3.18 g (40 mol %) of the compound (M-10), 3.57 g (30 mol %) of the compound (M-11), 0.332 g of azobisisobutyronitrile, and 30 g of 2-butanone. The mixture was stirred at 80° C. for 3 hours.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (A-4) (i.e., a copolymer of the compounds (M-1), (M-10), and (M-11)) (6.9 g, yield: 69%). The copolymer had an Mw of 9830 and an Mw/Mn ratio of 1.69. As a result of $^{13}$C-NMR analysis, it was found that the ratio of the content of structural units derived from the compound (M-1), the content of structural units derived from the compound (M-10), and the content of structural units derived from the compound (M-11) in the copolymer was 32:40:28 (mol %), and the fluorine atom content in the copolymer was 21.9 mass %.

Example 3

Production of Polymer (A-5)

A three-necked flask (50 ml) equipped with a thermometer and a reflux condenser was charged with 1.14 g (10 mol %) of the compound (M-1), 0.83 g (10 mol %) of the compound (M-10), 8.03 g (80 mol %) of the compound (M-12), 0.349 g of azobisisobutyronitrile, and 30 g of 2-butanone. The mixture was stirred at 80° C. for 3 hours.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (A-5) (i.e., a copolymer of the compounds (M-1), (M-10), and (M-12)) (7.1 g, yield: 71%). The copolymer had an Mw of 8670 and an Mw/Mn ratio of 1.63. As a result of $^{13}$C-NMR analysis, it was found that the ratio of the content of structural units derived from the compound (M-1), the content of structural units derived from the compound (M-10), and the content of structural units derived from the compound (M-12) in the copolymer was 11:10:79 (mol %), and the fluorine atom content in the copolymer was 15.3 mass %.

Example 4

Production of Polymer (A-6)

A three-necked flask (50 ml) equipped with a thermometer and a reflux condenser was charged with 0.79 g (10 mol %) of the compound (M-1), 0.58 g (10 mol %) of the compound (M-10), 8.63 g (80 mol %) of the compound (M-13), 0.242 g of azobisisobutyronitrile, and 30 g of 2-butanone. The mixture was stirred at 80° C. for 3 hours.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (A-6) (i.e., a copolymer of the compounds (M-1), (M-10), and (M-13)) (7.2 g, yield: 72%). The copolymer had an Mw of 8420 and an Mw/Mn ratio of 1.60. As a result of $^{13}$C-NMR analysis, it was found that the ratio of the content of structural units derived from the compound (M-1), the content of structural units derived from the compound (M-10), and the content of structural units derived from the compound (M-13) in the copolymer was 12:9:79 (mol %), and the fluorine atom content in the copolymer was 24.1 mass %.

Synthesis Example 4

Production of Polymer (a-1)

A three-necked flask (50 ml) equipped with a thermometer and a reflux condenser was charged with 5.00 g of the compound (M-2), 0.188 g of azobisisobutyronitrile, and 15 g of 2-butanone. The mixture was stirred at 80° C. for 3 hours under a nitrogen atmosphere.

After completion of polymerization, the polymer solution was cooled with water to 30° C. or less, and poured into 75 g of a solution of methanol and water (=8:2) to precipitate the polymer. After removing the supernatant liquid, 15 g of methanol was added to wash the precipitated polymer. After removing the supernatant liquid, the polymer was dried at 50° C. for 17 hours to obtain a polymer (a-1) (i.e., a polymer of the compound (M-2)) (3.6 g, yield: 71%). The polymer had an Mw of 11,900 and an Mw/Mn ratio of 2.01. As a result of $^{13}$C-NMR analysis, it was found that the content of structural units derived from the compound (M-2) in the polymer was 100 mol %, and the fluorine atom content in the polymer was 0 mass %.

Synthesis Example 5

Production of Polymer (a-2)

A three-necked flask (50 ml) equipped with a thermometer and a reflux condenser was charged with 3.23 g (30 mol %) of the compound (M-2), 2.54 g (30 mol %) of the compound (M-3), 4.23 g (40 mol %) of the compound (M-5), 0.413 g of azobisisobutyronitrile, and 30 g of 2-butanone. The mixture was stirred at 80° C. for 3 hours under a nitrogen atmosphere.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (a-2) (i.e., a copolymer of the compounds (M-2), (M-3), and (M-5)) (5.97 g, yield: 60%). The copolymer had an Mw of 9630 and an Mw/Mn ratio of 1.71. As a result of $^{13}$C-NMR analysis, it was found that the ratio of the content of structural units derived from the compound (M-2), the content of structural units derived from the compound (M-3), and the content of structural units derived from the compound (M-5) in the copolymer was 33:26:41 (mol %), and the fluorine atom content in the copolymer was 8.6 mass %.

Synthesis Example 6

Production of Polymer (a-3)

A three-necked flask (50 ml) equipped with a thermometer and a reflux condenser was charged with 2.69 g (30 mol %) of the compound (M-2), 3.84 g (30 mol %) of the compound (M-4), 3.50 g (40 mol %) of the compound (M-5), 0.352 g of azobisisobutyronitrile, and 30 g of 2-butanone. The mixture was stirred at 80° C. for 3 hours under a nitrogen atmosphere.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (A-4) (i.e., a copolymer of the compounds (M-2), (M-4), and (M-5)) (7.0 g, yield: 70%). The copolymer had an Mw of 9300 and an Mw/Mn ratio of 1.68. As a result of $^{13}$C-NMR analysis, it was found that the ratio of the content of structural units derived from the compound (M-2), the content of structural units derived from the compound (M-4), and the content of structural units derived from the compound (M-5) in the copolymer was 31:28:41 (mol %), and the fluorine atom content in the copolymer was 14.4 mass %.

Synthesis Example 7

Production of Polymer (a-4)

A three-necked flask (50 ml) equipped with a thermometer and a reflux condenser was charged with 2.78 g (30 mol %) of the compound (M-2), 3.40 g (40 mol %) of the compound (M-10), 3.82 g (30 mol %) of the compound (M-11), 0.355 g of azobisisobutyronitrile, and 30 g of 2-butanone. The mixture was stirred at 80° C. for 3 hours under a nitrogen atmosphere.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (a-4) (i.e., a copolymer of the compounds (M-2), (M-10), and (M-11)) (6.7 g, yield: 67%). The copolymer had an Mw of 9750 and an Mw/Mn ratio of 1.63. As a result of $^{13}$C-NMR analysis, it was found that the ratio of the content of structural units derived from the compound (M-2), the content of structural units derived from the compound (M-10), and the content of structural units derived from the compound (M-11) in the copolymer was 31:40:29 (mol %), and the fluorine atom content in the copolymer was 15.7 mass %.

Synthesis Example 8

Production of Polymer (a-5)

A three-necked flask (50 ml) equipped with a thermometer and a reflux condenser was charged with 0.93 g (10 mol %) of the compound (M-2), 0.85 g (10 mol %) of the compound (M-10), 3.57 g (80 mol %) of the compound (M-12), 0.357 g of azobisisobutyronitrile, and 30 g of 2-butanone. The mixture was stirred at 80° C. for 3 hours under a nitrogen atmosphere.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (a-5) (i.e., a copolymer of the compounds (M-2), (M-10), and (M-12)) (7.1 g, yield: 71%). The copolymer had an Mw of 8500 and an Mw/Mn ratio of 1.68. As a result of $^{13}$C-NMR analysis, it was found that the ratio of the content of structural units derived from the compound (M-2), the content of structural units derived from the compound (M-10), and the content of structural units derived from the compound (M-12) in the copolymer was 11:11:78 (mol %), and the fluorine atom content in the copolymer was 13.2 mass %.

Synthesis Example 9

Production of Polymer (a-6)

A three-necked flask (50 ml) equipped with a thermometer and a reflux condenser was charged with 0.64 g (10 mol %) of the compound (M-2), 0.59 g (10 mol %) of the compound (M-10), 8.77 g (80 mol %) of the compound (M-13), 0.246 g of azobisisobutyronitrile, and 30 g of 2-butanone. The mixture was stirred at 80° C. for 3 hours under a nitrogen atmosphere.

After completion of polymerization, the polymer solution was cooled with water to 30° C. or less, and poured into 150 g of a solution of methanol and water (=8:2) to precipitate the polymer. After removing the supernatant liquid, 30 g of methanol was added to the mixture to wash the precipitated polymer. After removing the supernatant liquid, the polymer was dried at 50° C. for 17 hours to obtain a polymer (a-6) (i.e., a copolymer of the compounds (M-2), (M-10), and (M-13)) (7.2 g, yield: 72%). The copolymer had an Mw of 8390 and an Mw/Mn ratio of 1.58. As a result of $^{13}$C-NMR analysis, it was found that the ratio of the content of structural units derived from the compound (M-2), the content of structural units derived from the compound (M-10), and the content of structural units derived from the compound (M-13) in the copolymer was 11:10:79 (mol %), and the fluorine atom content in the copolymer was 18.7 mass %.

Synthesis Example 10

Production of Polymer (C-1)

16.40 g (98 mmol, 40 mol %) of the compound (M-5), 5.73 g (24 mmol, 10 mol %) of the compound (M-6), and 21.74 g (98 mmol, 40 mol %) of the compound (M-8) were dissolved in 100 g of 2-butanone, and 2.01 g of dimethyl 2,2'-azobis(2-methylpropionate) was added to the solution to prepare a monomer solution. A three-necked flask (500 ml) charged with 50 g of 2-butanone and 6.07 g (24 mmol, 10 mol %) of the compound (M-7) was purged with nitrogen for 30 minutes, and heated to 80° C. with stirring. The monomer solution was added dropwise to the flask using a dropping funnel over 3 hours. The monomers were polymerized for 6 hours from the start of the dropwise addition of the monomer solution.

After completion of polymerization, the polymer solution was cooled with water to 30° C. or less, and poured into 1000 g of methanol. A white powder that precipitated was collected by filtration. The white powder thus collected was washed with 200 g of methanol in a slurry state, and collected by filtration. This operation was repeated once. The white powder was dried at 50° C. for 17 hours to obtain a white powdery copolymer (39 g, yield: 78%). The copolymer had an Mw of 6100 and an Mw/Mn ratio of 1.4. As a result of $^{13}$C-NMR analysis, it was found that the ratio of the content of structural units derived from the compound (M-6), the content of structural units derived from the compound (M-7), the content of structural units derived from the compound (M-8), and the content of structural units derived from the compound (M-9) in the copolymer was 42.2:8.4:8.1:41.3 (mol %), and the fluorine atom content in the copolymer was 0%. This copolymer is referred to as "polymer (C-1)".

The types and the amounts (mol %) of the monomer compounds used to produce the polymers in Examples 1 to 4 and Synthesis Examples 2 to 10 are shown in Table 1. The ratio (mol %) of the content of structural units derived from each compound based on the total structural units (determined by $^{13}$C-NMR analysis), the fluorine atom content (mass %) (determined by $^{13}$C-NMR analysis), the Mw (measured by GPC), and the Mw/Mn ratio of the polymers (A-1) to (A-6), (a-1) to (a-6), and (C-1) are also shown in Table 1. Note that the compound (M-1) produces the structural unit (I), the compounds (M-3), (M-4), and (M-11) to (M-13) produce the structural unit (II) or (III), the compounds (M-5) to (M-8) and (M-10) produce the structural unit (IV), the compound (M-9) produces the structural unit (VI), and the compound (M-2) produces the additional structural unit.

TABLE 1

| | Polymer | Monomer that produces structural unit (I) | | | Monomer that produces structural unit (II) or (III) | | | Monomer that produces structural unit (IV) | | |
|---|---|---|---|---|---|---|---|---|---|---|
| | | Type | Amount (mol %) | Structural unit content (mol %) | Type | Amount (mol %) | Structural unit content (mol %) | Type | Amount (mol %) | Structural unit content (mol %) |
| Example 1 | A-1 | M-1 | 100 | 100 | — | — | — | — | — | — |
| Example 2 | A-2 | M-1 | 30 | 33 | M-3 | 30 | 28 | M-5 | 40 | 41 |
| Example 3 | A-3 | M-1 | 30 | 32 | M-4 | 30 | 28 | M-5 | 40 | 40 |
| Example 4 | A-4 | M-1 | 30 | 32 | M-11 | 30 | 28 | M-10 | 40 | 40 |
| Example 5 | A-5 | M-1 | 10 | 11 | M-12 | 80 | 79 | M-10 | 10 | 10 |
| Example 6 | A-6 | M-1 | 10 | 12 | M-13 | 80 | 79 | M-10 | 10 | 9 |
| Synthesis Example 2 | a-1 | — | — | — | — | — | — | — | — | — |
| Synthesis Example 3 | a-2 | — | — | — | M-3 | 30 | 26 | M-5 | 40 | 41 |
| Synthesis Example 4 | a-3 | — | — | — | M-4 | 30 | 28 | M-5 | 40 | 41 |
| Synthesis Example 5 | a-4 | — | — | — | M-11 | 30 | 29 | M-10 | 40 | 40 |
| Synthesis Example 6 | a-5 | — | — | — | M-12 | 80 | 78 | M-10 | 10 | 11 |
| Synthesis Example 7 | a-6 | — | — | — | M-13 | 80 | 79 | M-10 | 10 | 10 |

TABLE 1-continued

| | | | | | | | | | Type | Amount | Structural unit content |
|---|---|---|---|---|---|---|---|---|---|---|---|
| Synthesis Example 8 | C-1 | — | — | — | — | — | — | — | M-6 | 40 | 42.2 |
| | | | | | | | | | M-7 | 10 | 8.1 |
| | | | | | | | | | M-8 | 10 | 8.4 |

| | Monomer that produces structural unit (VI) | | | Monomer that produces additional structural unit | | | | | |
|---|---|---|---|---|---|---|---|---|---|
| | Type | Amount (mol %) | Structural unit content (mol %) | Type | Amount (mol %) | Structural unit content (mol %) | Mw | Mw/Mn | Fluorine atom content (mass %) |
| Example 1 | — | — | — | — | — | — | 10,800 | 1.91 | 21.3 |
| Example 2 | — | — | — | — | — | — | 9420 | 1.72 | 15.9 |
| Example 3 | — | — | — | — | — | — | 10,200 | 1.72 | 20.2 |
| Example 4 | — | — | — | — | — | — | 9830 | 1.69 | 21.9 |
| Example 5 | — | — | — | — | — | — | 8670 | 1.63 | 15.3 |
| Example 6 | — | — | — | — | — | — | 8420 | 1.60 | 24.1 |
| Synthesis Example 2 | — | — | — | M-2 | 100 | 100 | 11,900 | 2.01 | 0 |
| Synthesis Example 3 | — | — | — | M-2 | 30 | 33 | 9630 | 1.71 | 8.6 |
| Synthesis Example 4 | — | — | — | M-2 | 30 | 31 | 9300 | 1.68 | 14.4 |
| Synthesis Example 5 | — | — | — | M-2 | 30 | 31 | 9750 | 1.63 | 15.7 |
| Synthesis Example 6 | — | — | — | M-2 | 10 | 11 | 8500 | 1.67 | 13.2 |
| Synthesis Example 7 | — | — | — | M-2 | 10 | 11 | 8390 | 1.58 | 18.7 |
| Synthesis Example 8 | M-9 | 40 | 41.3 | — | — | — | 6100 | 1.40 | 0 |

<Evaluation of Solubility of Resin Film>

A resin solution respectively containing the polymer (A-1), (A-2), (a-1), or (a-2) was prepared by the following method, and a resin film was formed using the resulting resin solution. The dissolution rate of the resin film in an alkaline developer was measured. Solvents (E-1) and (E-2) used to produce a radiation-sensitive resin composition (described later) were used to prepare the resin solution.

Test Example 1

Preparation of Resin Solution (S-1)

100 parts of the polymer (A-1), 900 parts of the solvent (E-1), and 380 parts of the solvent (E-2) were mixed to prepare a resin solution (S-1).

Test Example 2

Preparation of Resin Solution (S-2)

100 parts of the polymer (A-2), 900 parts of the solvent (E-1), and 380 parts of the solvent (E-2) were mixed to prepare a resin solution (S-2).

Comparative Test Example 1

Preparation of Resin Solution (s-1)

100 parts of the polymer (a-1), 900 parts of the solvent (E-1), and 380 parts of the solvent (E-2) were mixed to prepare a resin solution (s-1).

Comparative Test Example 2

Preparation of Resin Solution (s-2)

100 parts of the polymer (a-2), 900 parts of the solvent (E-1), and 380 parts of the solvent (E-2) were mixed to prepare a resin solution (s-2).

The resin solution thus prepared was spin-coated onto the surface of an 8-inch silicon wafer, and soft-baked (SB) at 100° C. for 60 seconds on a hot plate to form a resin film having a thickness of 250 nm.

The dissolution rate of the resin film in a 2.38% tetramethylammonium hydroxide aqueous solution (hereinafter may be referred to as "TMAH aqueous solution") at 25° C. was measured using an automatic development analyzer ("RDA-808" manufactured by Litho Tech Japan Corporation). The dissolution rate of each resin film thus measured is shown in Table 2.

TABLE 2

| | Resin solution | Polymer | Dissolution rate of resin film (nm/s) |
|---|---|---|---|
| Test Example 1 | S-1 | A-1 | 1800 |
| Test Example 2 | S-2 | A-2 | 230 |
| Comparative Test Example 1 | s-1 | a-1 | 1150 |
| Comparative Test Example 2 | s-2 | a-2 | 160 |

As is clear from the results for Test Examples 1 and 2, the resin films formed using a polymer including the structural unit (I) including the group shown by the formula (i) showed high solubility in an alkaline developer as compared with the resin films of Comparative Test Examples 1 and 2 formed using a polymer including a structural unit other than the structural unit (I).

<Production of Radiation-Sensitive Resin Composition>

The components (acid generator (B), acid diffusion controller (D), solvent (E), and additive (F)) of the radiation-sensitive resin composition other than the polymers (A-2) to (A-6), (a-2), (a-3), and (C-1) synthesized in the examples and the synthesis examples are given below.

(Acid generator (B))
(B-1): Compound Shown by the Following Formula (B-1)

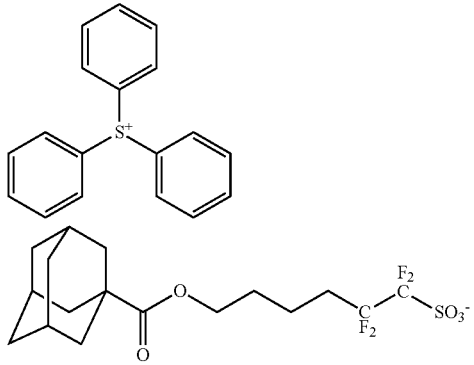

(B-1)

(Acid Diffusion Controller (D))
(D-1): Compound Shown by the Following Formula (D-1)

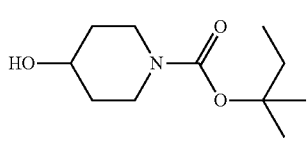

(D-1)

(Solvent (E))
(E-1): propylene glycol monomethyl ether acetate
(E-2): cyclohexanone
(Additive (F): Uneven Distribution Promoter)
(F-1): γ-butyrolactone Example 5

Production of Radiation-Sensitive Resin Composition (T-1)

100 parts of the polymer (C-1), 5 parts of the polymer (A-2), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (T-1).

Example 6

Production of Radiation-Sensitive Resin Composition (T-2)

100 parts of the polymer (C-1), 5 parts of the polymer (A-3), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (T-2).

Example 7

Production of Radiation-Sensitive Resin Composition (T-3)

100 parts of the polymer (C-1), 5 parts of the polymer (A-4), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (T-2).

Example 8

Production of Radiation-Sensitive Resin Composition (T-4)

100 parts of the polymer (C-1), 5 parts of the polymer (A-5), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (T-2).

Example 9

Production of Radiation-Sensitive Resin Composition (T-5)

100 parts of the polymer (C-1), 5 parts of the polymer (A-6), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (T-2).

Comparative Example 1

Production of Radiation-Sensitive Resin Composition (T-1)

100 parts of the polymer (C-1), 5 parts of the polymer (a-2), 12.1 parts of the acid generator (B-1), 1.5 parts of the acid diffusion controller (D-1), 1800 parts of the solvent (E-1), 700 parts of the solvent (E-2), and 30 parts of the additive (F-1) were mixed to obtain a radiation-sensitive resin composition (t-1).

Comparative Example 2

Production of Radiation-Sensitive Resin Composition (t-2)

100 parts of the polymer (C-1), 5 parts of the polymer (a-3), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (t-2).

Comparative Example 3

Production of Radiation-Sensitive Resin Composition (t-3)

100 parts of the polymer (C-1), 5 parts of the polymer (a-4), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (t-2).

Comparative Example 4

Production of Radiation-Sensitive Resin Composition (t-4)

100 parts of the polymer (C-1), 5 parts of the polymer (a-5), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (t-2).

Comparative Example 5

Production of Radiation-Sensitive Resin Composition (t-5)

100 parts of the polymer (C-1), 5 parts of the polymer (a-6), 12.1 parts of the acid generator (B-1), 1.5 parts of the acid diffusion controller (D-1), 1800 parts of the solvent (E-1), 770 parts of the solvent (E-2), and 30 parts of the additive (F-1) were mixed to obtain a radiation-sensitive resin composition (t-2).

[Measurement of Receding Contact Angle]

A resin film having a thickness of 100 nm was formed on an 8-inch silicon wafer using each of the radiation-sensitive resin compositions (T-1) to (T-5) and (t-1) to (t-5) obtained in the examples and the comparative examples in the same manner as in the case of measuring the dissolution rate of the resin film.

The position of the wafer stage of a contact angle meter ("DSA-10" manufactured by KRUS) was adjusted, and the wafer was placed on the stage. After injecting water into the needle, the position of the needle was finely adjusted to an initial position at which a water droplet can be formed on the wafer. Water was then discharged from the needle to form a water droplet (25 μl) on the wafer. After removing the needle, the needle was moved downward to the initial position, and introduced into the water droplet. The water droplet was sucked via the needle for 90 seconds at a rate of 10 μl/min, and the contact angle was measured every second (90 times in total). The average value of twenty contact angle measured values (20 seconds) after the measured value became stable was calculated, and taken as the receding contact angle (°).

The receding contact angle measured when using each of the radiation-sensitive resin compositions (T-1) to (T-5) and (t-1) to (t-5) is shown in Table 3.

TABLE 3

|  | Radiation-sensitive resin composition | Component (A) | Receding contact angle (°) |
|---|---|---|---|
| Example 5 | T-1 | A-2 | 71 |
| Example 6 | T-2 | A-3 | 76 |
| Example 7 | T-3 | A-4 | 70 |
| Example 8 | T-4 | A-5 | 74 |
| Example 9 | T-5 | A-6 | 76 |
| Comparative Example 1 | t-1 | a-2 | 59 |
| Comparative Example 2 | t-2 | a-3 | 63 |
| Comparative Example 3 | t-3 | a-4 | 57 |
| Comparative Example 4 | t-4 | a-5 | 66 |
| Comparative Example 5 | t-5 | a-6 | 69 |

As is clear from the results for Examples 5 to 9, the resin films formed using the radiation-sensitive resin compositions including the polymer including the structural unit (I) including the group shown by the formula (i) had a high receding contact angle. Therefore, it is considered that the resin films exhibit excellent water followability during liquid immersion lithography. As is clear from the results for Comparative Examples 1 to 5, the resin films formed using the polymer that does not include the group shown by the formula (i) had a low (insufficient) receding contact angle.

Since the radiation-sensitive resin composition according to one embodiment of the invention includes the polymer that includes a specific structural unit including a fluorine atom and a β-diketo structure, the photoacid generator, and a specific polymer that includes an acid-labile group, a resist film formed by the liquid immersion lithography process exhibits a high dynamic contact angle during exposure, and exhibits high solubility in an alkaline developer and a rinse agent during the alkali development process. Therefore, elution from the resist film can be suppressed, and high-speed scan exposure can be implemented since the surface of the film has a high draining capability. Moreover, an excellent resist pattern can be formed by suppressing occurrence of defects (e.g., watermark defects and development defects).

The radiation-sensitive resin composition according to the invention may suitably be used as a chemically-amplified resist for producing semiconductor devices (particularly a resist for liquid immersion lithography).

Obviously, numerous modifications and variations of the invention are possible in light of the above teachings. It is therefore to be understood that within the scope of the appended claims, the invention may be practiced otherwise than as specifically described herein.

What is claimed is:

1. A resin composition comprising a polymer comprising:
a structural unit (I) including a group shown by a formula (i); and
at least one structural unit selected from the group consisting of a structural unit (II) shown by a formula (2) and a structural unit (III) shown by a formula (3),
wherein a content of the structural unit (I) in the polymer is 10 to 90 mol % based on total structural units included in the polymer,

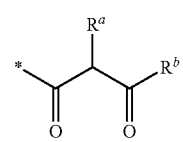

(i)

wherein $R^a$ represents a hydrogen atom, a halogen atom, a nitro group, —$R^{a1}$, —O—$R^{a1}$, —CO—$R^{a1}$, or —CO—O—$R^{a1}$, wherein $R^{a1}$ represents a monovalent chain-like hydrocarbon group having 1 to 20 carbon atoms, a monovalent alicyclic hydrocarbon group having 3 to 20 carbon atoms, a monovalent aromatic hydrocarbon group having 6 to 30 carbon atoms, or a monovalent aromatic-aliphatic hydrocarbon group having 7 to 30 carbon atoms, $R^b$ represents a monovalent chain-like hydrocarbon group having 1 to 10 carbon atoms that includes at least one fluorine atom, or a monovalent alicyclic hydrocarbon group having 3 to 20 carbon atoms that includes at least one fluorine atom, provided that $R^b$ and $R^a$ may bond to each other to form a cyclic structure including at least one fluorine atom, and * indicates a bonding site, provided that a plurality of $R^a$ and a plurality of $R^b$ may respectively be either the same or different when n is 2 or 3,

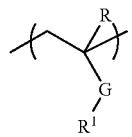

(2)

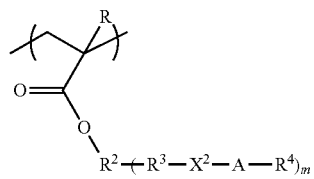

(3)

wherein R represents a hydrogen atom, a methyl group, or a trifluoromethyl group, G represents a single bond, an oxygen atom, a sulfur atom, —CO—O—, —SO₂—O—NH—, —CO—NH—, or —O—CO—NH—, $R^1$ represents a monovalent chain-like hydrocarbon group having 1 to 6 carbon atoms that includes at least one fluorine atom, or a monovalent alicyclic hydrocarbon group having 4 to 20 carbon atoms that includes at least one fluorine atom, $R^2$ represents an (m+1)-valent hydrocarbon group having 1 to 20 carbon atoms, provided that an oxygen atom, a sulfur atom, —NR'—, a carbonyl group, —CO—O—, or —CO—NH— may be bonded to an end of $R^2$ that is bonded to $R^3$, wherein R' represents a hydrogen atom or a monovalent organic group, $R^3$ represents a single bond, a divalent chain-like hydrocarbon group having 1 to 10 carbon atoms, or a divalent alicyclic hydrocarbon group having 4 to 20 carbon atoms, $X^2$ represents a divalent chain-like hydrocarbon group having 1 to 20 carbon atoms that includes at least one fluorine atom, A represents an oxygen atom, —NR"—, —CO—O—*, or —SO₂—O—*, wherein R" represents a hydrogen atom or a monovalent organic group and * indicates a bonding site bonded to $R^4$, $R^4$ represents a hydrogen atom or a monovalent organic group, and m is an integer from 1 to 3, provided that a plurality of $R^3$, a plurality of $X^2$, a plurality of A, and a plurality of $R^4$ may respectively be either the same or different when m is 2 or 3.

2. The resin composition according to claim 1, wherein the structural unit (I) is a structural unit (I-1) shown by a formula (1),

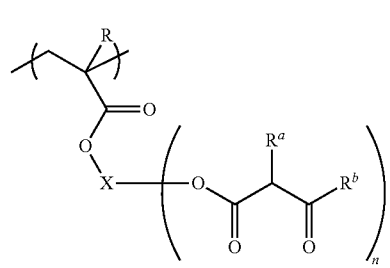

(1)

wherein R represents a hydrogen atom, a methyl group, or a trifluoromethyl group, X represents an (n+1)-valent linking group, $R^a$ and $R^b$ are the same as defined for the formula (1), and n is an integer from 1 to 3.

3. The resin composition according to claim 2, wherein X in the formula (1) represents a divalent or trivalent chain-like hydrocarbon group or alicyclic hydrocarbon group, and n is 1 or 2.

4. The resin composition according to claim 1, wherein $R^b$ in the formula (i) represents a trifluoromethyl group.

5. A method for forming a resist pattern comprising (1) forming a photoresist film on a substrate using the radiation-sensitive resin composition according to claim 1, (2) providing an immersion liquid over the photoresist film, and subjecting the photoresist film to liquid immersion lithography via the immersion liquid, and (3) developing the photoresist film subjected to liquid immersion lithography to form a resist pattern.

6. A polymer comprising a structural unit (I) including a group shown by a formula (i), and at least one structural unit selected from the group consisting of a structural unit (II) shown by a formula (2) and a structural unit (III) shown by a formula (3), wherein a content of the structural unit (I) in the polymer is 10 to 90 mol % based on total structural units included in the polymer,

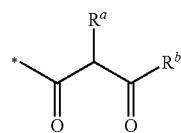

(1)

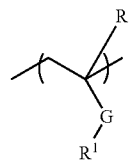

(2)

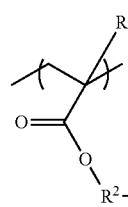

(3)

wherein $R^a$ represents a hydrogen atom, a halogen atom, a nitro group, —$R^{a1}$, —O—$R^{a1}$, —CO—$R^{a1}$, or —CO—O—$R^{a1}$, wherein $R^{a1}$ represents a monovalent chain-like hydrocarbon group having 1 to 20 carbon atoms, a monovalent alicyclic hydrocarbon group having 3 to 20 carbon atoms, a monovalent aromatic hydrocarbon group having 6 to 30 carbon atoms, or a monovalent aromatic-aliphatic hydrocarbon group having 7 to 30 carbon atoms, $R^b$ represents a monovalent chain-like hydrocarbon group having 1 to 10 carbon atoms that includes at least one fluorine atom, or a monovalent alicyclic hydrocarbon group having 3 to 20 carbon atoms that includes at least one fluorine atom, provided that $R^b$ and $R^a$ may bond to each other to form a cyclic structure including at least one fluorine atom, * indicates a bonding site, R represents a hydrogen atom, a methyl group, or a trifluoromethyl group, G represents a single bond, an oxygen atom, a sulfur atom, —CO—O—, —SO$_2$—O—NH—, —CO—NH—, or —O—CO—NH—, $R^1$ represents a monovalent chain-like hydrocarbon group having 1 to 6 carbon atoms that includes at least one fluorine atom, or a monovalent alicyclic hydrocarbon group having 4 to 20 carbon atoms that includes at least one fluorine atom, $R^2$ represents an (m+1)-valent hydrocarbon group having 1 to 20 carbon atoms, provided that an oxygen atom, a sulfur atom, —NR', a carbonyl group, —CO—O—, or —CO—NH— may be bonded to an end of $R^2$ that is bonded to $R^3$, wherein R' represents a hydrogen atom or a monovalent organic group, $R^3$ represents a single bond, a divalent chain-like hydrocarbon group having 1 to 10 carbon atoms, or a divalent alicyclic hydrocarbon group having 4 to 20 carbon atoms, $X^2$ represents a divalent chain-like hydrocarbon group having 1 to 20 carbon atoms that includes at least one fluorine atom, A represents an oxygen atom, —NR", —CO—O—*, or —SO$_2$—O—*, wherein R" represents a hydrogen atom or a monovalent organic group and * indicates a bonding site bonded to $R^4$, $R^4$ represents a hydrogen atom or a monovalent organic group, and m is an integer from 1 to 3, provided that a plurality of $R^3$, a plurality of $X^2$, a plurality of A, and a plurality of $R^4$ may respectively be either the same or different when m is 2 or 3.

7. The resin composition according to claim 1, wherein the polymer includes the structural unit (III).

* * * * *